US012672365B2

(12) United States Patent
Saito et al.

(10) Patent No.: US 12,672,365 B2
(45) Date of Patent: Jun. 30, 2026

(54) SEMICONDUCTOR DEVICE, METHOD FOR MANUFACTURING SEMICONDUCTOR DEVICE, AND ELECTRONIC DEVICE

(71) Applicant: SONY SEMICONDUCTOR SOLUTIONS CORPORATION, Kanagawa (JP)

(72) Inventors: Suguru Saito, Kanagawa (JP); Nobutoshi Fujii, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 423 days.

(21) Appl. No.: 18/256,984

(22) PCT Filed: Oct. 29, 2021

(86) PCT No.: PCT/JP2021/040047
§ 371 (c)(1),
(2) Date: Jun. 12, 2023

(87) PCT Pub. No.: WO2022/130804
PCT Pub. Date: Jun. 23, 2022

(65) Prior Publication Data
US 2024/0047503 A1 Feb. 8, 2024

(30) Foreign Application Priority Data
Dec. 18, 2020 (JP) ................................. 2020-210140

(51) Int. Cl.
*H10F 39/00* (2025.01)
(52) U.S. Cl.
CPC ......... *H10F 39/014* (2025.01); *H10F 39/018* (2025.01); *H10F 39/024* (2025.01);
(Continued)

(58) Field of Classification Search
CPC .... H10F 39/014; H10F 39/024; H10F 39/018; H10F 39/026; H10F 39/8057;
(Continued)

(56) References Cited

U.S. PATENT DOCUMENTS 8,860,229 B1* 10/2014 Lin ..................... H10W 20/023
257/774
2002/0089055 A1 7/2002 Clevenger et al.
(Continued)

FOREIGN PATENT DOCUMENTS

JP 2002-026123 A 1/2002
JP 2014-143399 A 8/2014
(Continued)

OTHER PUBLICATIONS

International Search Report and Written Opinion of PCT Application No. PCT/JP2021/040047, issued on Jan. 11, 2022, 11 pages of ISRWO.

*Primary Examiner* — Moazzam Hossain
(74) *Attorney, Agent, or Firm* — CHIP LAW GROUP

(57) ABSTRACT

Provided are a semiconductor device capable of lowering the temperature of the entire joining process to room temperature, a method for manufacturing a semiconductor device, and an electronic device. The semiconductor device includes: a first insulating film; a plurality of first joining electrodes formed on a surface of the first insulating film; a second insulating film; a plurality of second joining electrodes formed on a surface of the second insulating film; and a metal film covering an entire surface of a joining surface including the first insulating film and the plurality of first joining electrodes and an entire surface of a joining surface including the second insulating film and the plurality of second joining electrodes. The first insulating film includes a first dug portion that is formed between at least some joining electrodes of the plurality of first joining electrodes (Continued)

and separating the metal film between the joining electrodes. The second insulating film includes a second dug portion formed between at least some joining electrodes of the plurality of second joining electrodes and separating the metal film between the joining electrodes.

18 Claims, 17 Drawing Sheets

(52) U.S. Cl.
CPC ....... *H10F 39/026* (2025.01); *H10F 39/8037* (2025.01); *H10F 39/8053* (2025.01); *H10F 39/8057* (2025.01); *H10F 39/811* (2025.01)

(58) Field of Classification Search
CPC .... H10F 39/811; H10F 39/12; H10F 39/8037; H10P 14/40; H10W 20/01; H10W 20/40; H10W 90/00
USPC ........................................................ 267/292
See application file for complete search history.

(56)                    References Cited

U.S. PATENT DOCUMENTS

| | | | | |
|---|---|---|---|---|
| 2013/0341694 A1* | 12/2013 | Maekawa | ............. | H10F 77/334 |
| | | | | 257/435 |
| 2014/0284744 A1* | 9/2014 | Fujii | ..................... | H10F 39/018 |
| | | | | 438/57 |
| 2015/0021785 A1* | 1/2015 | Lin | ........................ | H10W 90/00 |
| | | | | 438/459 |
| 2016/0181228 A1* | 6/2016 | Higuchi | ................ | H10W 40/00 |
| | | | | 257/774 |
| 2020/0295068 A1* | 9/2020 | Sato | .................... | H10F 39/8057 |
| 2020/0395295 A1* | 12/2020 | Tsai | ...................... | H10W 20/42 |
| 2021/0407938 A1* | 12/2021 | Hatazaki | .............. | H10W 20/42 |

FOREIGN PATENT DOCUMENTS

| | | | |
|---|---|---|---|
| JP | 2015-115446 | A | 6/2015 |
| JP | 5994274 | B2 | 9/2016 |
| JP | 2019-047043 | A | 3/2019 |
| WO | 2015/040784 | A1 | 3/2015 |
| WO | 2018/211974 | A1 | 11/2018 |

* cited by examiner

FIG. 8A
FIG. 8B
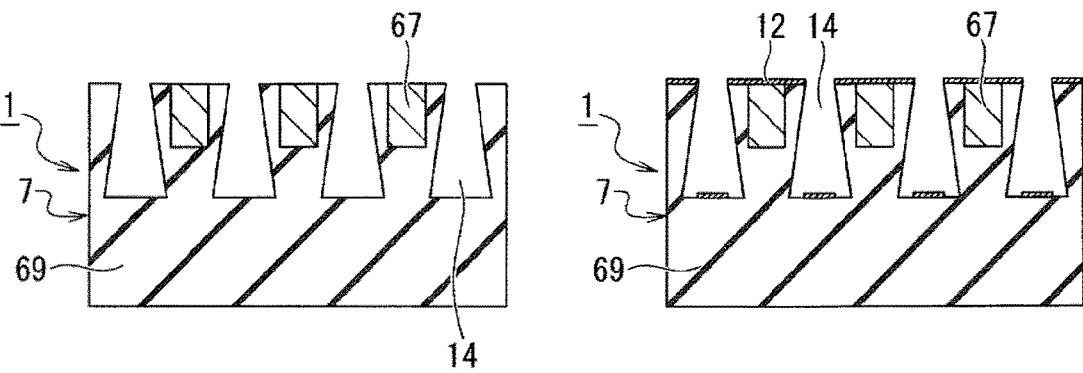
FIG. 8C
FIG. 8D
FIG. 8E
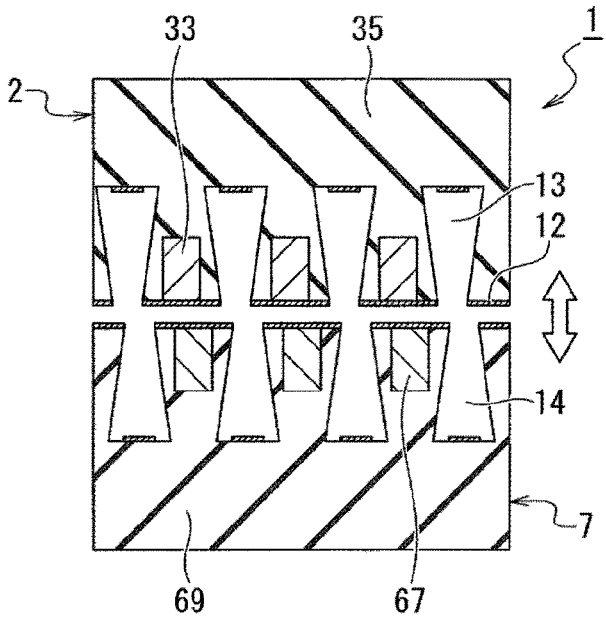

FIG. 9A
FIG. 9B
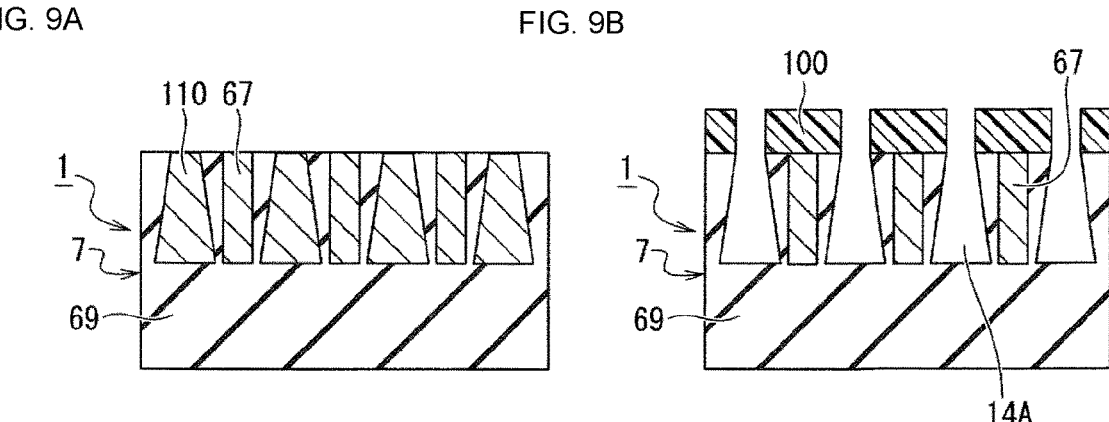
FIG. 9C
FIG. 9D
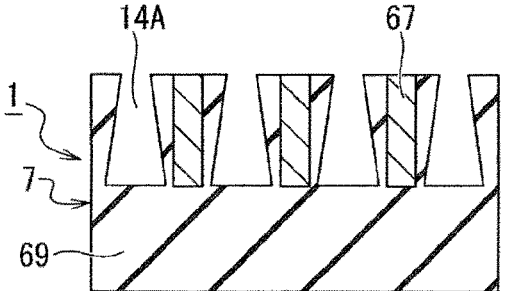
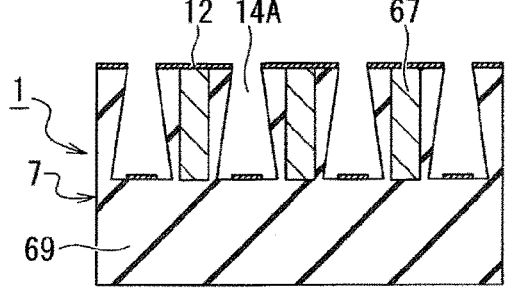
FIG. 9E
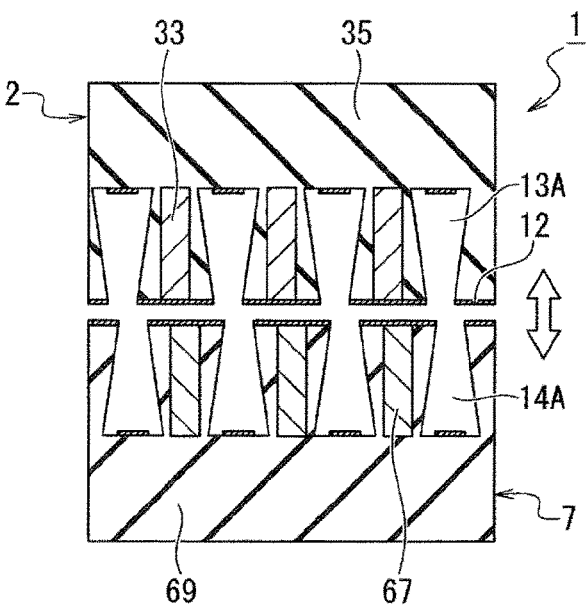

SEMICONDUCTOR DEVICE, METHOD FOR MANUFACTURING SEMICONDUCTOR DEVICE, AND ELECTRONIC DEVICE

CROSS REFERENCE TO RELATED APPLICATIONS

This application is a U.S. National Phase of International Patent Application No. PCT/JP2021/040047 filed on Oct. 29, 2021, which claims priority benefit of Japanese Patent Application No. JP 2020-210140 filed in the Japan Patent Office on Dec. 18, 2020. Each of the above-referenced applications is hereby incorporated herein by reference in its entirety.

TECHNICAL FIELD

The technology (present technology) according to the present disclosure relates to a semiconductor device, a method for manufacturing a semiconductor device, and an electronic device.

BACKGROUND ART

High integration of semiconductor devices has been realized by introduction of a fine process in a two-dimensional LSI and improvement in mounting density. In recent years, physical limitations of miniaturization have begun to appear, and three-dimensional LSI technology has attracted attention.

As a basic technology in the three-dimensional LSI technology, there is a joining technique. There are various types of joining techniques, and a technique of joining chips to each other and a technique of joining wafers to each other have been studied. When a three-dimensional LSI is created by bonding device wafers to each other, there is a method for directly joining Cu (copper) electrodes on a device surface formed on a wafer surface. In this method, there is a method for planarizing the Cu electrode and the eyebrow insulating film on the same plane and performing hybrid joining of the Cu/eyebrow insulating film (for example, Patent Document 1).

As a method for performing hybrid joining, there is an atomic diffusion joining technique of sputtering silicon (Si) or metal in vacuum, and it is possible to lower the temperature at the time of joining to room temperature.

CITATION LIST

Patent Document

Patent Document 1: Japanese Patent No. 5994274

SUMMARY OF THE INVENTION

Problems to be Solved by the Invention

Meanwhile, in a case where the atomic diffusion joining technique is applied to a hybrid structure in which an insulating film and an electrode exist on the same plane, Si or metal deposited on the insulating film serves as a leak source between the electrodes, and thus insulation by annealing (ANL) processing is required after joining. The ANL temperature is required to be 200° C. or higher, and it is difficult to realize a low temperature of 150° C. or lower as the entire joining process.

The present disclosure has been made in view of such circumstances, and an object thereof is to provide a semiconductor device, a method for manufacturing a semiconductor device, and an electronic device capable of lowering the temperature of the entire joining process to room temperature.

Solutions to Problems

An aspect of the present disclosure is a semiconductor device including: a first insulating film formed on a first semiconductor substrate; a plurality of first joining electrodes formed on a surface of the first insulating film; a second insulating film formed on a second semiconductor substrate that is hybrid joined to the first semiconductor substrate; a plurality of second joining electrodes formed on a surface of the second insulating film; and a metal film covering an entire surface of a joining surface including the first insulating film and the plurality of first joining electrodes, and an entire surface of a joining surface including the second insulating film and the plurality of second joining electrodes, in which the first insulating film includes a first dug portion formed between at least some joining electrodes of the plurality of first joining electrodes and separating the metal film between the joining electrodes, and the second insulating film includes a second dug portion formed between at least some joining electrodes of the plurality of second joining electrodes and separating the metal film between the joining electrodes.

Another aspect of the present disclosure is a method for manufacturing a semiconductor device, the method including: forming a plurality of first joining electrodes on a surface of a first insulating film formed on a first semiconductor substrate; forming a plurality of second joining electrodes on a surface of a second insulating film formed on a second semiconductor substrate; forming a first dug portion obtained by digging the first insulating film between at least some joining electrodes of the plurality of first joining electrodes; forming a second dug portion obtained by digging the second insulating film between at least some joining electrodes of the plurality of second joining electrodes; covering an entire surface of a joining surface including the first insulating film and the plurality of first joint electrodes and a bottom surface of the first dug portion with a metal film; covering an entire surface of a joining surface including the second insulating film and the plurality of second joint electrodes and a bottom surface of the second dug portion with a metal film; and hybrid joining the plurality of first joining electrodes of the first semiconductor substrate and the plurality of second joining electrodes of the second semiconductor substrate.

Further, another aspect of the present disclosure is an electronic device including a semiconductor device including: a first insulating film formed on a first semiconductor substrate; a plurality of first joining electrodes formed on a surface of the first insulating film; a second insulating film formed on a second semiconductor substrate that is hybrid joined to the first semiconductor substrate; a plurality of second joining electrodes formed on a surface of the second insulating film; and a metal film covering an entire surface of a joining surface including the first insulating film and the plurality of first joining electrodes, and an entire surface of a joining surface including the second insulating film and the plurality of second joining electrodes, in which the first insulating film includes a first dug portion formed between at least some joining electrodes of the plurality of first joining electrodes and separating the metal film between the joining electrodes, and the second insulating film includes a second dug portion formed between at least some joining electrodes of the plurality of second joining electrodes and separating the metal film between the joining electrodes.

BRIEF DESCRIPTION OF DRAWINGS

FIGS. 8A, 8B, 80, 8D, and 8E are diagrams illustrating a process flow for forming a semiconductor device according to a second embodiment of the present technology.

FIGS. 9A, 9B, 9C, 9D, and 9E are diagrams illustrating a process flow for forming a semiconductor device according to a third embodiment of the present technology.

FIG. 17 is a view illustrating an example of a schematic configuration of an endoscopic surgery system.

FIG. 19 is a block diagram illustrating an example of schematic configuration of a vehicle control system.

MODE FOR CARRYING OUT THE INVENTION

Figure 1:
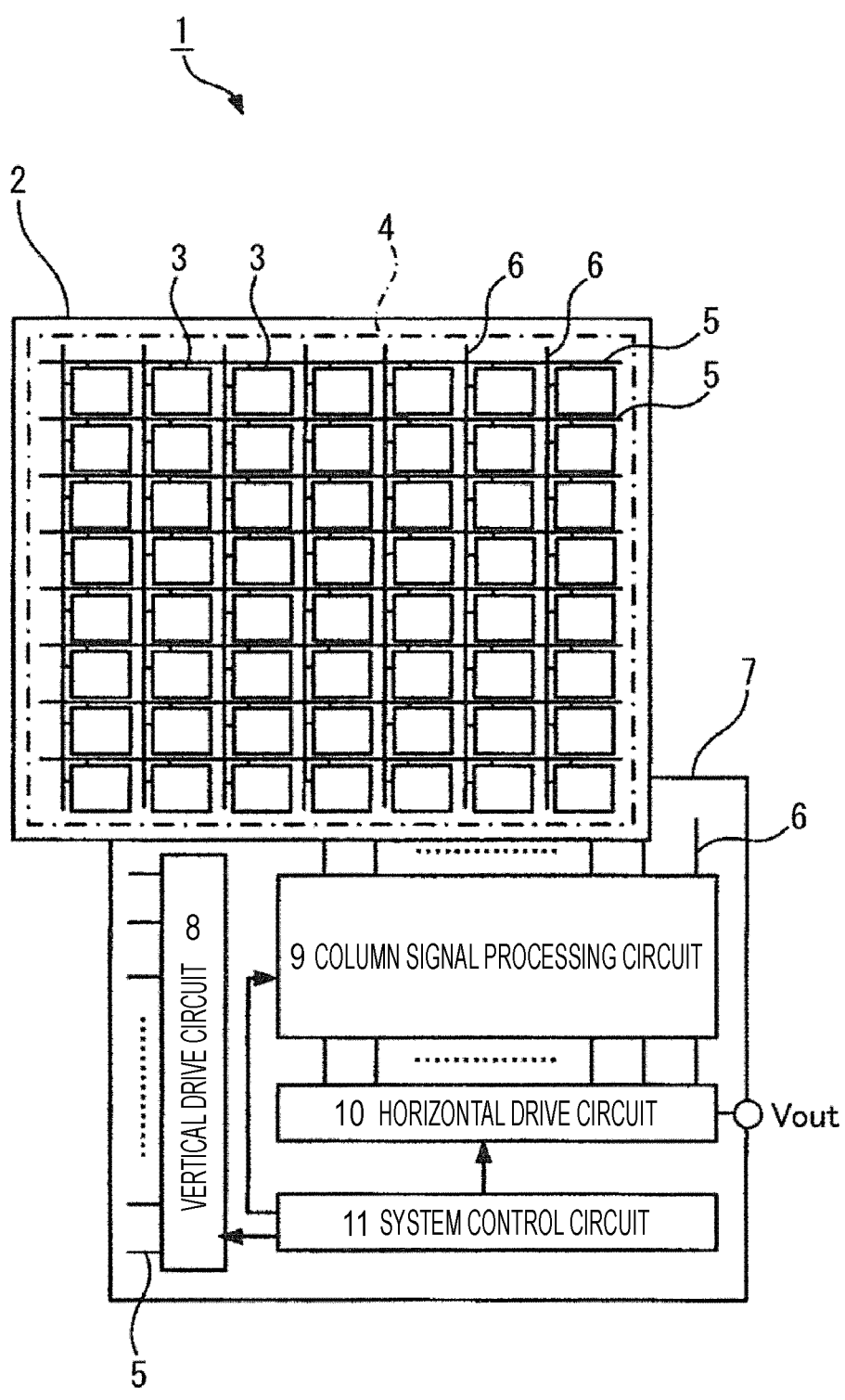
FIG. 1 is a schematic configuration diagram of an image sensor as an example of a semiconductor device to which the present technology is applied.

Hereinafter, embodiments of the present disclosure will be described with reference to the drawings. In the description of the drawings referred to in the following description, the same or similar parts are denoted by the same or similar reference numerals, and redundant description is omitted. However, it should be noted that the drawings are schematic, and the relationship between the thickness and the plane dimension, the ratio of the thickness of each device and each member, and the like are different from actual ones. Therefore, specific thicknesses and dimensions should be determined in consideration of the following description. Furthermore, it is needless to say that the drawings include portions having different dimensional relationships and ratios.

In addition, the definitions of directions such as up and down or the like in the following description are merely definitions for convenience of description, and do not limit the technical idea of the present disclosure. For example, it is a matter of course that when an object is observed by rotating the object by 90°, the up and down are converted into and read as left and right, and when the object is observed by rotating the object by 180°, the up and down are inverted and read.

Note that the effects described in the present specification are merely examples and are not limited, and other effects may be provided.

First Embodiment (Configuration Example of Image Sensor)

FIG. 1 is a schematic configuration diagram of an image sensor as an example of a semiconductor device to which the present technology is applied.

A semiconductor device 1 illustrated in FIG. 1 is a semiconductor device (image sensor) having a so-called three-dimensional structure including a first substrate 2 as a sensor substrate and a second substrate 7 as a circuit substrate laminated and bonded to the first substrate 2.

Among them, the first substrate 2 is provided with a pixel region 4 in which a plurality of pixels 3 including photoelectric conversion units is regularly two-dimensionally arranged. In the pixel region 4, a plurality of pixel drive lines 5 is wired in the row direction, a plurality of vertical signal lines 6 is wired in the column direction, and one pixel 3 is arranged in a state of being connected to one pixel drive line 5 and one vertical signal line 6. Each of these pixels 3 is provided with a photoelectric conversion unit, a floating diffusion, and a pixel circuit including a plurality of transistors (MOS transistors), a capacitive element, and the like. Note that a plurality of pixels may share a part of the pixel circuit. Furthermore, as the transistor constituting the pixel circuit, for example, at least one of a transfer transistor, a reset transistor, an amplification transistor, or a selection transistor is provided on the first substrate 2 or the second substrate 7.

In addition, the second substrate 7 is provided with peripheral circuits such as a vertical drive circuit 8 for driving each pixel 3 provided on the first substrate 2, a column signal processing circuit 9, a horizontal drive circuit 10, and a system control circuit 11.

(Configuration of Semiconductor Device of First Embodiment)

Figure 2:
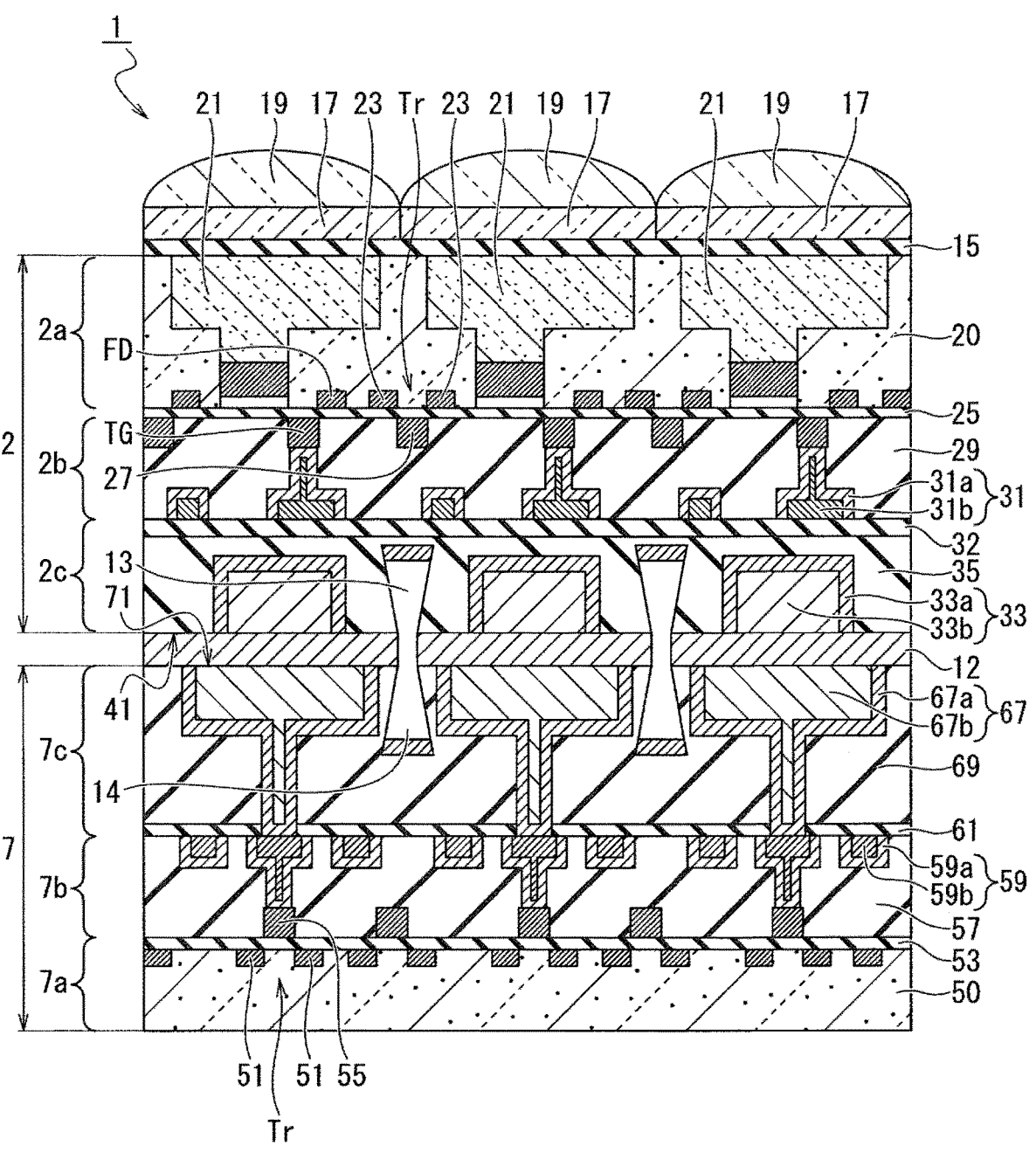
FIG. 2 is a cross-sectional view of a main part illustrating the configuration of the semiconductor device according to the first embodiment of the present technology.

FIG. 2 is a cross-sectional view of a main part illustrating the configuration of the semiconductor device according to the first embodiment of the present technology, and is a cross-sectional view of three pixels in FIG. 1. Hereinafter, a detailed configuration of the semiconductor device of the first embodiment will be described on the basis of the cross-sectional view of the main part.

A semiconductor device 1 illustrated in FIG. 2 is an image sensor having a three-dimensional structure in which a bonding surface 41 of the first substrate 2 and a bonding surface 71 of the second substrate 7 are arranged to face each other in a state of sandwiching a metal thin film 12, and the first substrate 2 and the second substrate 7 are bonded to each other.

Here, in the first substrate 2, a semiconductor layer 2a, a wiring layer 2b, and an electrode layer 2c are laminated in this order from the side opposite to the second substrate 7, and the surface of the electrode layer 2c is configured as the bonding surface 41 to the second substrate 7. Meanwhile, in the second substrate 7, a semiconductor layer 7a, a wiring layer 7b, and an electrode layer 7c are laminated in this order from the side opposite to the first substrate 2, and the surface of the electrode layer 7c is configured as the bonding surface 71 to the first substrate 2.

In addition, a protective film 15, a color filter layer 17, and on-chip lenses 19 are laminated in the illustrated order on a surface of the first substrate 2 opposite to the second substrate 7.

Next, detailed configurations of the layers constituting the first substrate 2 and the second substrate 7 and the metal thin film 12 will be sequentially described, and configurations of the protective film 15, the color filter layer 17, and the on-chip lenses 19 will be sequentially described.

(Semiconductor Layer 2a (First Substrate 2 Side))

The semiconductor layer 2a on the first substrate 2 side is obtained by thinning a semiconductor substrate 20 constituted by, for example, single crystal silicon. In the semiconductor layer 2a, a photoelectric conversion unit 21 including, for example, an n-type impurity layer (or a p-type impurity layer) is provided for each pixel on the first surface side where the color filter layer 17, the on-chip lens 19, and the like are arranged. Meanwhile, on the second substrate side of the semiconductor layer 2a, the floating diffusion FD including an n+ type impurity layer, a source/drain 23 of the transistor Tr, other impurity layers not illustrated here, and the like are provided.

(Wiring Layer 2b (First Substrate 2 Side))

The wiring layer 2b provided on the semiconductor layer 2a in the first substrate 2 includes a transfer gate TG provided with a gate insulating film 25 interposed therebetween, a gate electrode 27 of the transistor Tr, and other electrodes not illustrated here, on the interface side with the semiconductor layer 2a. The transfer gate TG and the gate electrode 27 are covered with an interlayer insulating film 29, and embedded wiring 31 is provided in a groove pattern formed in the interlayer insulating film 29. The embedded wiring 31 includes a barrier metal layer 31a covering an inner wall of the groove pattern, and a wiring layer 31b constituted by copper (Cu) embedded in the groove pattern with the barrier metal layer 31a interposed therebetween.

Note that the wiring layer 2b as described above may be configured as a multilayer wiring layer further laminated.

(Electrode Layer 2c (First Substrate 2 Side))

The electrode layer 2c provided on the wiring layer 2b in the first substrate 2 includes an anti-diffusion insulating film 32 for copper (Cu) and a first insulating film 35 laminated thereon on the interface side with the wiring layer 2b. The first insulating film 35 is constituted by, for example, a TEOS film, and a first electrode 33 is provided as a buried electrode in a groove pattern formed in the first insulating film 35. The TEOS film is a silicon oxide film formed by a chemical vapor deposition (hereinafter referred to as a CVD method) using tetra ethoxy silane gas (TEOS gas: composition Si (OC2H5)4) as a raw material gas. Then, the first electrode 33 includes a barrier metal layer 33a covering an inner wall of the groove pattern, and a first electrode film 33b constituted by copper (Cu) embedded in the groove pattern with the barrier metal layer 33a interposed therebetween.

The surface of the electrode layer 2c having such a configuration serves as the bonding surface 41 on the first substrate 2 side with respect to the second substrate 7. The bonding surface 41 is configured such that the first electrode 33 and the first insulating film 35 are exposed, and is planarized by, for example, chemical mechanical polishing (hereinafter referred to as CMP).

Note that, although not illustrated here, a part of the groove pattern provided in the first insulating film 35 reaches the embedded wiring 31 provided in the wiring layer 2b, and the first electrode 33 embedded in the groove pattern is connected to the embedded wiring 31 as necessary.

(Semiconductor Layer 7a (Second Substrate 7 Side))

Meanwhile, the semiconductor layer 7a on the second substrate 7 side is obtained by thinning a semiconductor substrate 50 constituted by, for example, single crystal silicon. In the semiconductor layer 7a, a source/drain 51 of the transistor Tr, an impurity layer not illustrated here, and the like are provided on a surface layer on the first substrate 2 side.

(Wiring Layer 7b (Second Substrate 7 Side))

The wiring layer 7b provided on the semiconductor layer 7a in the second substrate 7 includes a gate electrode 55 provided with a gate insulating film 53 interposed therebetween, and other electrodes not illustrated here, on the interface side with the semiconductor layer 7a. The gate electrode 55 and the other electrodes are covered with an interlayer insulating film 57, and embedded wiring 59 is provided in a groove pattern formed in the interlayer insulating film 57. The embedded wiring 59 includes a barrier metal layer 59a covering an inner wall of the groove pattern, and a wiring layer 59b constituted by copper (Cu) embedded in the groove pattern with the barrier metal layer 59a interposed therebetween.

Note that the wiring layer 7b as described above may have a multilayer wiring layer structure.

(Electrode Layer 7c (Second Substrate 7 Side))

The electrode layer 7c provided on the wiring layer 7b in the second substrate 7 includes an anti-diffusion insulating film 61 for copper (Cu) and a second insulating film 69 laminated thereon on the interface side with the wiring layer 7b. The second insulating film 69 is constituted by, for example, a TEOS film, and a second electrode 67 is provided as a buried electrode in a groove pattern formed in the second insulating film 69. The second electrode 67 includes a barrier metal layer 67a covering an inner wall of the groove pattern, and a second electrode film 67b constituted by copper (Cu) embedded in the groove pattern with the barrier metal layer 67a interposed therebetween. The second electrode 67 is disposed so as to correspond to the first electrode 33 on the first substrate 2 side, and is electrically connected to the first electrode 33 on the first substrate 2 side via the metal thin film 12.

The surface of such an electrode layer 7c serves as the bonding surface 71 on the second substrate 7 side with respect to the first substrate 2. The bonding surface 71 is configured such that the second electrode 67 and the second insulating film 69 are exposed, and is planarized by, for example, CMP.

(Protective Film 15, Color Filter Layer 17, and On-Chip Lenses 19)

The protective film 15 is provided to cover the photoelectric conversion unit 21 of the first substrate 2. The protective film 15 is constituted by a material film having a passivation property, and for example, a silicon oxide film, a silicon nitride film, or a silicon oxynitride film is used.

The color filter layer 17 includes color filters of respective colors provided on a one-to-one basis corresponding to the respective photoelectric conversion units 21. The arrangement of the color filters of the respective colors is not limited.

The on-chip lenses 19 are provided on a one-to-one basis corresponding to the respective photoelectric conversion units 21 and the color filters of the respective colors constituting the color filter layer 17, and are configured such that incident light is condensed on the respective photoelectric conversion units 21.

(Metal Thin Film 12)

The metal thin film 12 is sandwiched between the bonding surface 41 on the first substrate 2 side and the bonding surface 71 on the second substrate 7 side, and covers the entire surfaces of the bonding surface 41 and the bonding surface 71. That is, the first substrate 2 and the second substrate 7 are bonded to each other with the metal thin film 12 interposed therebetween.

In the first embodiment, a dug portion 13 is provided between the adjacent first electrodes 33, and a dug portion 14 is provided between the adjacent second electrodes 67.

(Operation of Semiconductor Device 1)

In the semiconductor device 1 having the above configuration, the emitted light is transmitted through the on-chip lens 19 and the color filter layer 17, and the transmitted light is photoelectrically converted by the photoelectric conversion unit 21, whereby signal charges are generated. Then, the generated signal charge is output to the second substrate 7 via the first electrode 33 and the second electrode 67 as a pixel signal by the vertical signal line 6 illustrated in FIG. 1 formed by the embedded wiring 31 via the transistor Tr formed in the wiring layer 2b. In the second substrate 7, signal processing such as noise removal is performed on the signals output from the pixels 3 of one row for each pixel column. For example, the second substrate 7 performs signal processing such as correlated double sampling (CDS) and analog digital (AD) conversion for removing fixed pattern noise unique to pixels.

<Comparative Example of Embodiment>

FIGS. 3A, 3B, 3C, and 3D illustrate a process of bonding the bonding surface 41 on the first substrate 2 side and the bonding surface 71 on the second substrate 7 side as a comparative example.

Figure 3A:
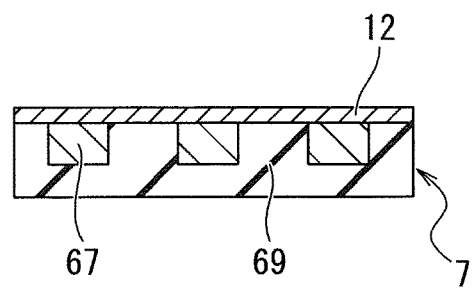
FIGS. 3A, 3B, 3C, and 3D are views illustrating a process of bonding a bonding surface on a first substrate side and a bonding surface on a second substrate side as a comparative example.

As illustrated in FIG. 3A, the metal thin film 12 is formed on the entire surface to cover the surfaces of the second electrode 67 and the second insulating film 69 formed on the second substrate 7. In the metal thin film 12, a material such as Ti or Ta is formed to a thickness of 10 to 100 nm using an atomic layer deposition (ALD) method, a chemical vapor deposition (CVD) method, or the like. After the formation of the metal thin film 12, the surface is planarized using a CMP method or the like as necessary.

Figure 3B:
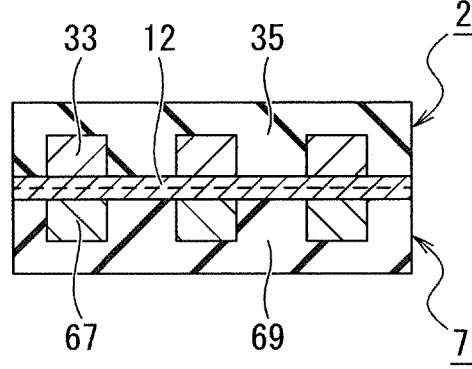

The first substrate 2 formed by the method illustrated in FIG. 3A is prepared, and wet processing using, for example, formic acid or dry processing using plasma such as Ar, NH3, or H2 is performed on the bonding surface 41 on the first substrate 2 side and the bonding surface 71 on the second substrate 7 side. By this processing, oxide films on the surface of the first electrode 33 and the surface of the second electrode 67 are removed, and a clean metal surface is exposed. Then, as illustrated in FIG. 3B, the bonding surface 41 on the first substrate 2 side and the bonding surface 71 on the second substrate 7 side are made to face each other and are joined to each other.

Figure 3C:
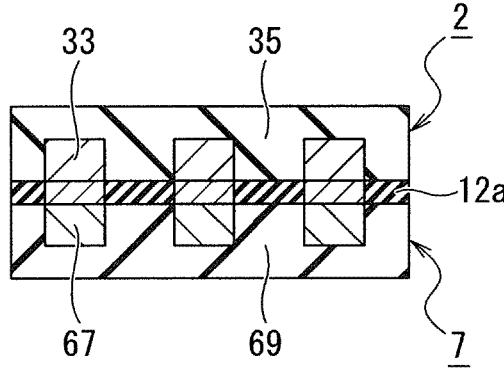
Figure 3D:
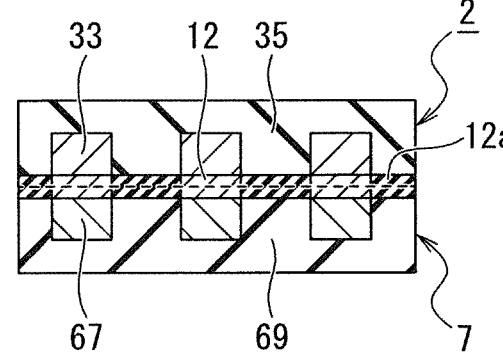

Meanwhile, in a case where the above joining technology is applied to a hybrid structure in which the first electrode 33 and the first insulating film 35 are present on the same plane and a hybrid structure in which the second electrode 67 and the second insulating film 69 are present on the same plane, silicon (Si) or metal deposited on the first insulating film 35 and the second insulating film 69 become leakage sources between the first electrode 33 and between the second electrode 67, and thus insulation by annealing (ANL) processing is required after joining, as illustrated in FIG. 3C. The ANL processing is processing in which heat processing is performed in an N2 atmosphere or vacuum at atmospheric pressure, for example, by an annealing apparatus such as a hot plate or an RTA. Through this ANL processing, the metal thin film 12 in a portion in contact with the first insulating film 35 and the second insulating film 69 reacts. As a result, as illustrated in FIG. 3D, an insulating film 12a constituted by a reaction product is formed between the first substrate 2 and the second substrate 7.

However, the ANL temperature is required to be 200° C. or higher, and it is difficult to realize a low temperature of 150° C. or lower as the entire joining process.

<Solving Means of First Embodiment>

Therefore, in the first embodiment, hybrid joining using atomic diffusion has a structure having a recessed shape between electrodes on a hybrid joining surface.

Figure 4:
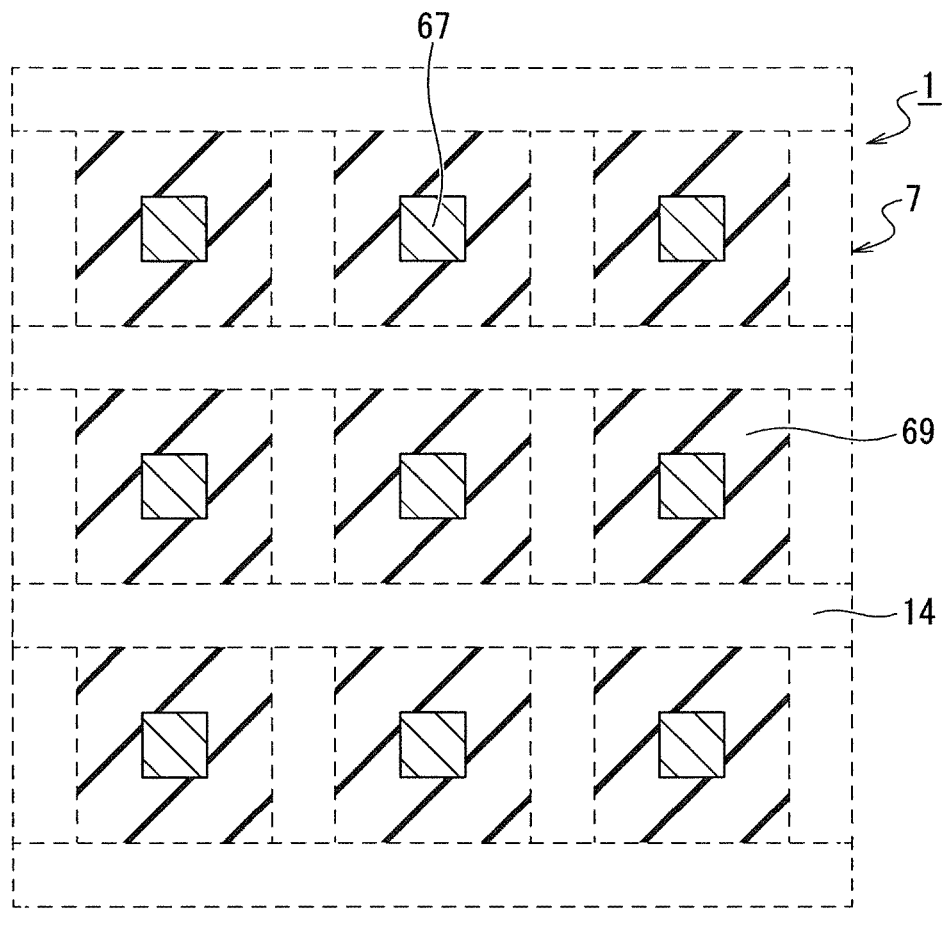
FIG. 4 is a plan view of a second substrate as viewed from a light incident side in the first embodiment.
Figure 5:
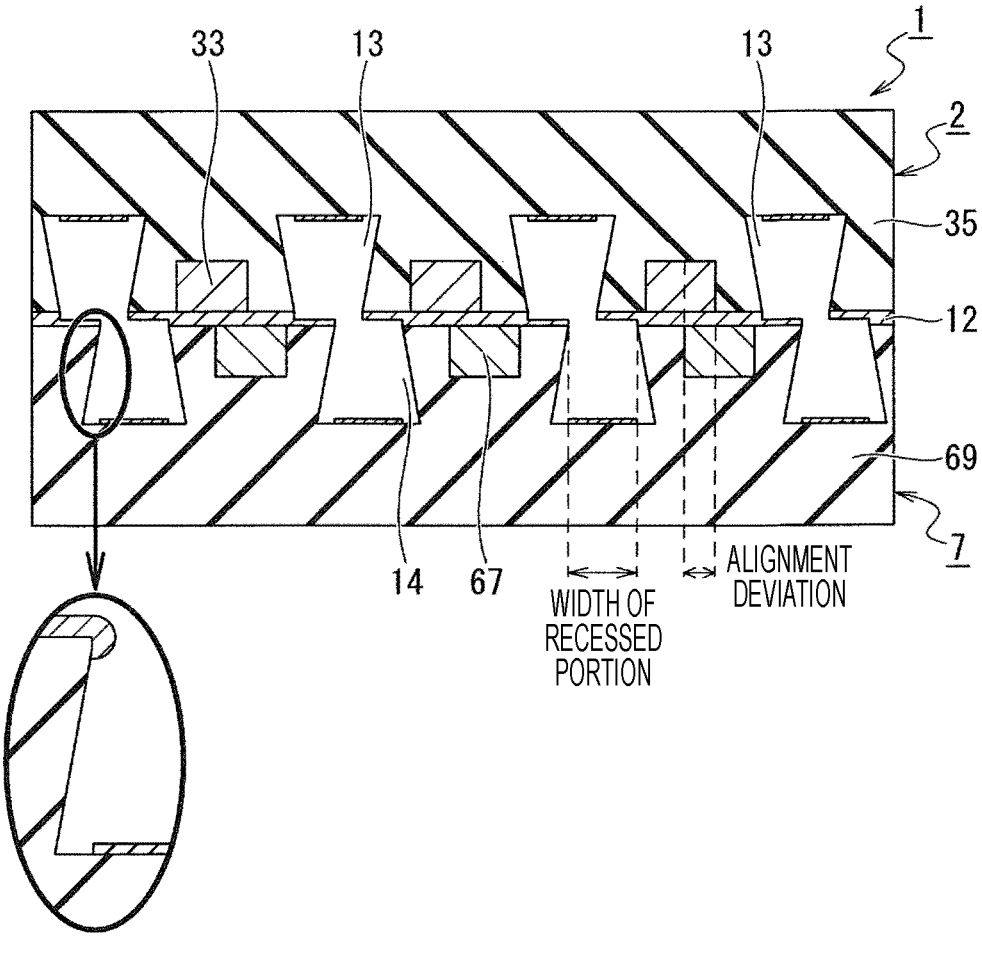
FIG. 5 is a cross-sectional view illustrating a state in which a bonding surface on a first substrate side and a bonding surface on a second substrate side are bonded together in the first embodiment.

FIG. 4 is a plan view of the second substrate 7 as viewed from the light incident side in the first embodiment. FIG. 5 is a cross-sectional view illustrating a state in which the bonding surface 41 on the first substrate 2 side and the bonding surface 71 on the second substrate 7 side are bonded together in the first embodiment.

FIG. 4 illustrates a case where the plurality of second electrodes 67 is arranged at equal pitches in the row direction and the column direction. The plurality of second electrodes 67 is electrically separated by a dug portion 14 obtained by digging the second insulating film 69. The dug portion 14 is formed in a lattice shape so as to surround each of the second electrodes 67. Note that the arrangement pattern of the second electrodes 67 is not limited to the case of FIG. 4, and various arrangement patterns can be adopted.

In FIG. 5, a dug portion 13 in which the first insulating film 35 is dug is formed between the adjacent first electrodes 33. In addition, a dug portion 14 formed by digging the second insulating film 69 is formed between the adjacent second electrodes 67. The dug portions 13 and 14 divide the metal thin film 12. In addition, the dug portions 13 and 14 have a reverse tapered shape, and the metal thin film 12 is divided in the middle.

Further, the dug portions 13 and 14 can also absorb alignment deviation between the first electrode 33 and the second electrode 67. In this case, the opening width of each of the dug portions 13 and 14 is larger than twice the alignment deviation generated at the time of joining the first electrode 33 and the second electrode 67. Note that the opening width is an opening width on the bonding surface 41 side on the first substrate 2 side and an opening width on the bonding surface 71 side on the second substrate 7 side.

<Operation and Effect of First Embodiment>

As described above, according to the first embodiment, the separation of the metal thin film 12 between the first electrodes 33 is performed by the dug portion 13, and the separation of the metal thin film 12 between the second electrodes 67 is performed by the dug portion 14, whereby the temperature of the entire joining process can be lowered to room temperature. In addition, by providing a gap structure on the bonding surface 41 on the first substrate 2 side and the bonding surface 71 on the second substrate 7 side, a reduction in capacity can be expected.

In addition, according to the first embodiment, by forming the dug portions 13 and 14 in a reverse tapered shape, it is possible to create a vacuum having a large volume, whereby the temperature of the entire joining process can be lowered to room temperature.

Furthermore, according to the first embodiment, in a case where the alignment deviation occurring at the time of joining the first electrode 33 and the second electrode 67 can be predicted to some extent, the alignment deviation can be absorbed by making the opening width of each of the dug portions 13 and 14 larger than twice the alignment deviation.

<First Modification of First Embodiment>

Figure 6:
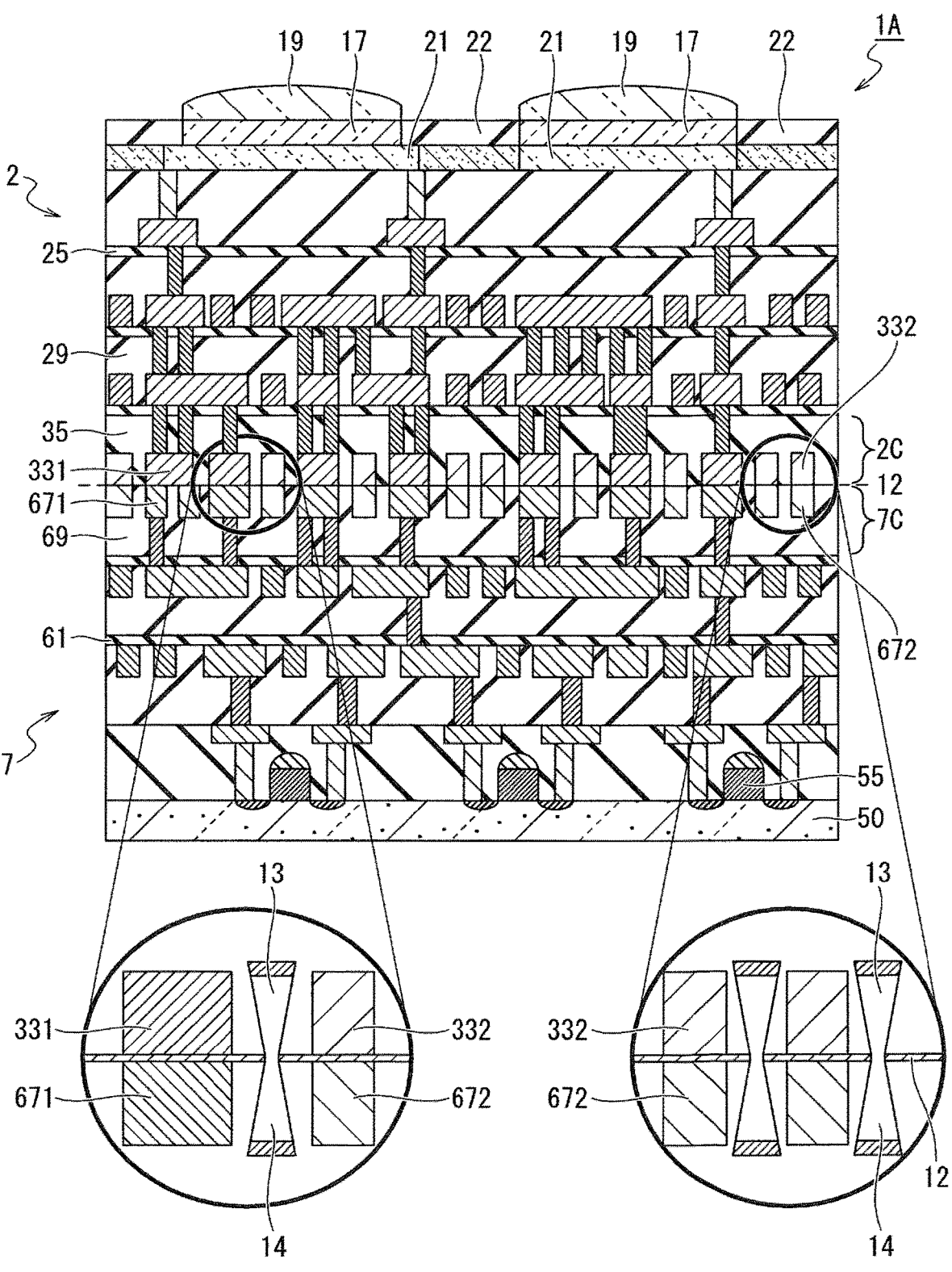
FIG. 6 is a cross-sectional view of a main part illustrating a configuration of a semiconductor device as a first modification of the first embodiment of the present technology.

FIG. 6 is a cross-sectional view of a main part illustrating a configuration of a semiconductor device as a first modification of the first embodiment of the present technology. In FIG. 6, the same portions as those in FIG. 2 above are denoted by the same reference numerals, and detailed description thereof will be omitted.

In the semiconductor device 1A, an insulating film 22 is formed in a region other than the color filter layer 17. One pixel 3 is formed for each set of the color filter layer 17, the on-chip lens 19, and the photoelectric conversion unit 21.

In the first substrate 2, the first insulating film 35 is constituted by, for example, a TEOS film, and a first electrode pad 331 and a dummy electrode 332 are provided as buried electrodes in the groove pattern formed in the first insulating film 35.

In the second substrate 7, the second insulating film 69 is constituted by, for example, a TEOS film, and a second electrode pad 671 and a dummy electrode 672 are provided as buried electrodes in the groove pattern formed in the second insulating film 69.

Meanwhile, in the first modification of the first embodiment, the dug portion 13 in which the first insulating film 35 is dug is formed between the adjacent first electrode pad 331 and the dummy electrode 332 and between the adjacent dummy electrodes 332. In addition, the dug portion 14 in which the second insulating film 69 is dug is formed between the adjacent second electrode pad 671 and the dummy electrode 672 and between the adjacent dummy electrodes 672. The dug portions 13 and 14 have a reverse tapered shape, and the metal thin film 12 is divided in the middle.

As described above, even in the first modification of the first embodiment, similar effects to those of the first embodiment can be obtained.

<Second Modification of First Embodiment>

Figure 7:
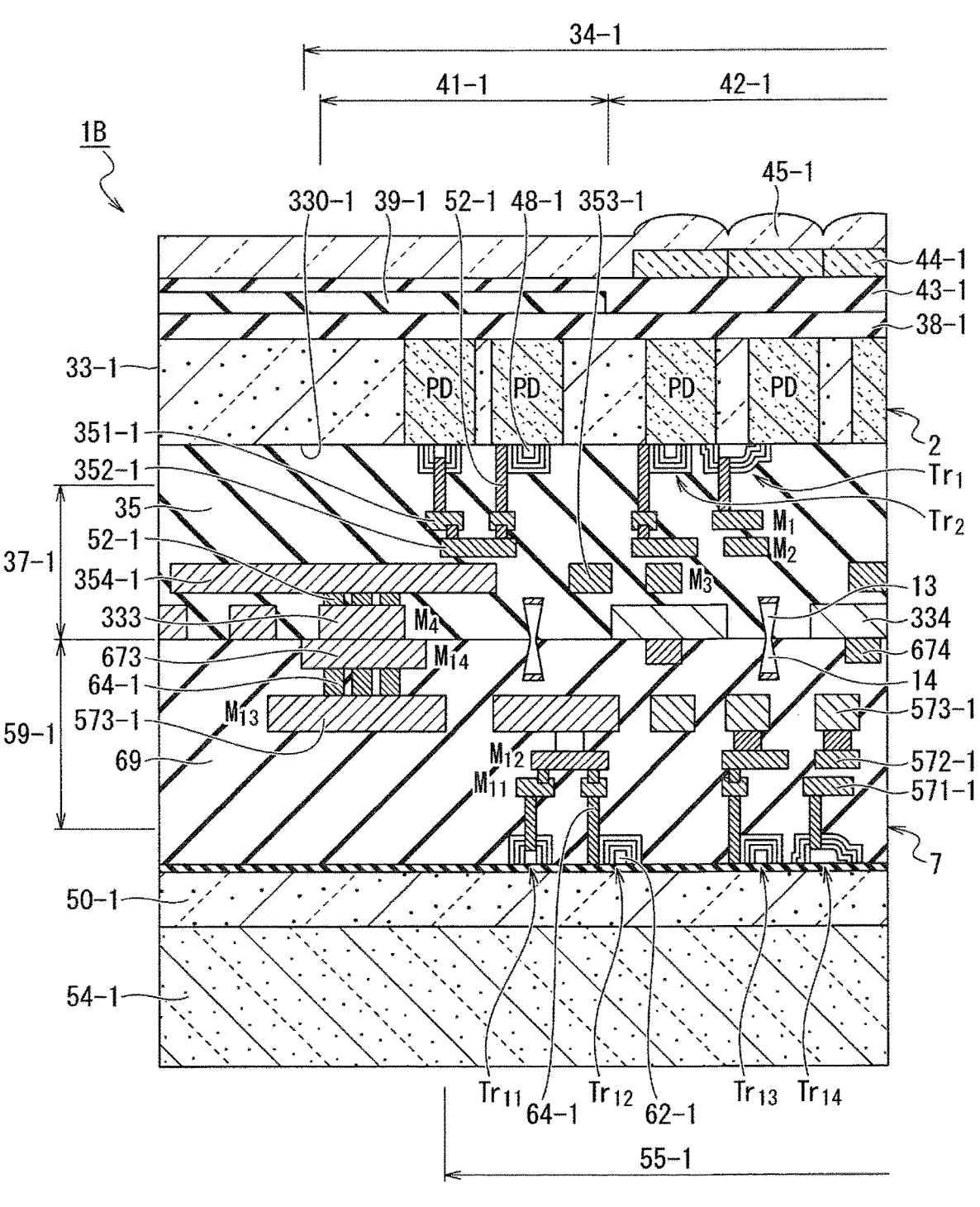
FIG. 7 is a cross-sectional view of a main part illustrating a configuration of a semiconductor device as a second modification of the first embodiment of the present technology.

FIG. 7 is a cross-sectional view of a main part illustrating a configuration of a semiconductor device as a second modification of the first embodiment of the present technology. In FIG. 7, the same portions as those in FIG. 2 above are denoted by the same reference numerals, and detailed description thereof will be omitted.

In the semiconductor device 1B, in the first substrate 2, a pixel array 34 in which a plurality of pixels including a photodiode PD serving as a photoelectric conversion unit and a plurality of pixel transistors Tr1 and Tr2 is two-dimensionally arranged in a column shape is formed on a first semiconductor substrate 33-1 constituted by thinned silicon. In addition, although not illustrated, a plurality of MOS transistors constituting a control circuit is formed on the first semiconductor substrate 33-1. On a front surface 330-1 side of the first semiconductor substrate 33-1, a multilayer wiring layer 37-1 in which wirings 351-1 to 354-1 and wiring 333 of a plurality of, in this example, four layers of metal M1 to M4 are arranged is formed with the first insulating film 35 interposed therebetween. As the wirings 351-1 to 354-1 and the wiring 333, a copper (Cu) wiring formed by a dual damascene method is used. On the back surface side of the first semiconductor substrate 33-1, a light shielding film 39-1 is formed including an optical black region 41-1 with an insulating film 38-1 interposed therebetween, and a color filter 44-1 and an on-semiconductor substrate lens 45-1 are further formed on an effective pixel array 42-1 with a flattening film 43-1 interposed therebetween. The on-semiconductor substrate lens 45-1 can also be formed on the optical black region 41-1.

In the multilayer wiring layer 37-1 of the first substrate 2, the corresponding pixel transistors and the wirings 351-1 to 354-1, and the adjacent upper and lower wirings 351-1 to 354-1 and the wiring 333 are connected via a conductive via 52-1. Furthermore, the wiring 333 is connected to a required wiring 354-1 by the metal M3 of the third layer via the conductive via 52-1. In addition, a vertical signal line 6 is formed in the third layer.

In the second substrate 7, a logic circuit 55-1 constituting a peripheral circuit is formed in a region to be each semiconductor substrate of the second semiconductor substrate 54-1 constituted by silicon. The logic circuit 55-1 includes a plurality of MOS transistors Tr11 to Tr14 including CMOS transistors. On the front surface side of the second semiconductor substrate 54-1, a multilayer wiring layer 59-1 in which wirings 571-1 to 574-1 and wiring 673 by a plurality of layers, in this example, four layers of metal M11 to M14 are arranged is formed with the second insulating film 69 interposed therebetween. As the wirings 571-1 to 574-1 and the wiring 673, a copper (Cu) wiring by a dual damascene method is used.

In the multilayer wiring layer 59-1 of the second substrate 7, the MOS transistors Tr11 to Tr14 and the wirings 571-1 to 573-1, and the adjacent upper and lower wirings 571-1 to 573-1 are connected via a conductive via 64-1. Furthermore, a wiring 673 constituted by the fourth metal M14 is formed facing the joining surface with the first substrate 2. The wiring 673 is connected to a required wiring 573-1 by the third metal M13 via the conductive via 64-1.

The first substrate 2 and the second substrate 7 are bonded to each other with the metal thin film 12 interposed therebetween.

Meanwhile, in the second modification of the first embodiment, the dug portion 13 formed by digging the first insulating film 35 is formed between the wiring 333 and the wiring 334 and between the adjacent wirings 334. In addition, a dug portion 14 in which the second insulating film 69 is dug is formed between the wiring 673 and the wiring 674 and between the adjacent wirings 674. The dug portions 13 and 14 have a reverse tapered shape, and the metal thin film 12 is divided in the middle.

As described above, even in the second modification of the first embodiment, similar effects to those of the first embodiment can be obtained.

Second Embodiment

Next, a second embodiment will be described. In the second embodiment, a method for manufacturing the semiconductor device according to the first embodiment described above will be described.

FIGS. 8A, 8B, 80, 8D, and 8E illustrate a process flow for forming the semiconductor device 1 according to the second embodiment of the present technology.

As illustrated in FIG. 8A, the surfaces of the second electrode 67 and the second insulating film 69 formed on the second substrate 7 are planarized using a CMP method or the like as necessary to form a hybrid structure.

After the hybrid structure is formed, as illustrated in FIG. 8B, a resist pattern 100 is formed on the surfaces of the second electrode 67 and the second insulating film 69 by using lithography, and a DRY etching process is performed on the second insulating film 69 to form the dug portion 14 between the second electrodes 67. When the shape of the dug portion 14 is the reverse tapered shape, separation between the second electrodes 67 can be reliably performed at the time of metal film sputtering of atomic diffusion joining.

Next, as illustrated in FIG. 8C, resist peeling is performed to remove the resist pattern 100. At this time, CMP may be performed again for cleaning the joining surface, that is, the bonding surface 71 after resist peeling.

Next, as illustrated in FIG. 8D, metal sputtering is performed in an atomic diffusion joining apparatus to form a metal thin film 12 on the surface of the second electrode 67. Thereafter, as illustrated in FIG. 8E, the first substrate 2 formed by the method illustrated in FIGS. 8A, 8B, 8C, and 8D are prepared, and the bonding surface 41 on the first substrate 2 side and the bonding surface 71 on the second substrate 7 side are aligned and joined.
<Operation and Effect of Second Embodiment>

As described above, according to the second embodiment, similar effects to those of the first embodiment can be obtained.

Third Embodiment

Next, a third embodiment will be described. In the third embodiment, another method for manufacturing the semiconductor device according to the first embodiment described above will be described.

FIGS. 9A, 9B, 9C, 9D, and 9E illustrate a process flow for forming the semiconductor device 1 according to the third embodiment of the present technology.

As illustrated in FIG. 9A, the surfaces of the second electrode 67 and the second insulating film 69 formed on the second substrate 7 are planarized using a CMP method or the like as necessary to form a hybrid structure. At the same time, a reverse taper dummy pattern 110 is formed.

After the hybrid structure is formed, as illustrated in FIG. 9B, a resist pattern 100 is formed on the surfaces of the second electrode 67, the second insulating film 69, and the reverse taper dummy pattern 110 by using lithography, the reverse taper dummy pattern 110 is subjected to WET etching processing to remove the Cu electrode of the reverse taper dummy pattern 110, and a dug portion 14A is formed between the second electrodes 67.

Next, as illustrated in FIG. 9C, resist peeling is performed to remove the resist pattern 100. At this time, CMP may be performed again for cleaning the joining surface, that is, the bonding surface 71 after resist peeling.

Next, as illustrated in FIG. 9D, metal sputtering is performed in an atomic diffusion joining apparatus to form a metal thin film 12 on the surface of the second electrode 67. Thereafter, as illustrated in FIG. 9E, the first substrate 2 formed by the method illustrated in FIGS. 9A, 9B, 9C, and 9D are prepared, and the bonding surface 41 on the first substrate 2 side and the bonding surface 71 on the second substrate 7 side are aligned and joined to each other.
<Operation and Effect of Third Embodiment>

As described above, according to the third embodiment, by forming the reverse taper dummy pattern 110, the depth of the first electrode 33 and the dug portion 13 and the depth of the second electrode 67 and the dug portion 14 can be made uniform, the formation region of the dug portions 13 and 14 can be reduced, and accordingly, it is possible to contribute to miniaturization of the semiconductor device 1.

Fourth Embodiment

Next, a fourth embodiment will be described. The fourth embodiment is a modification of the first embodiment described above, and a case where the dug portion has a ring shape and the joining electrode is formed at the center portion of the ring shape will be described.

Figure 10:
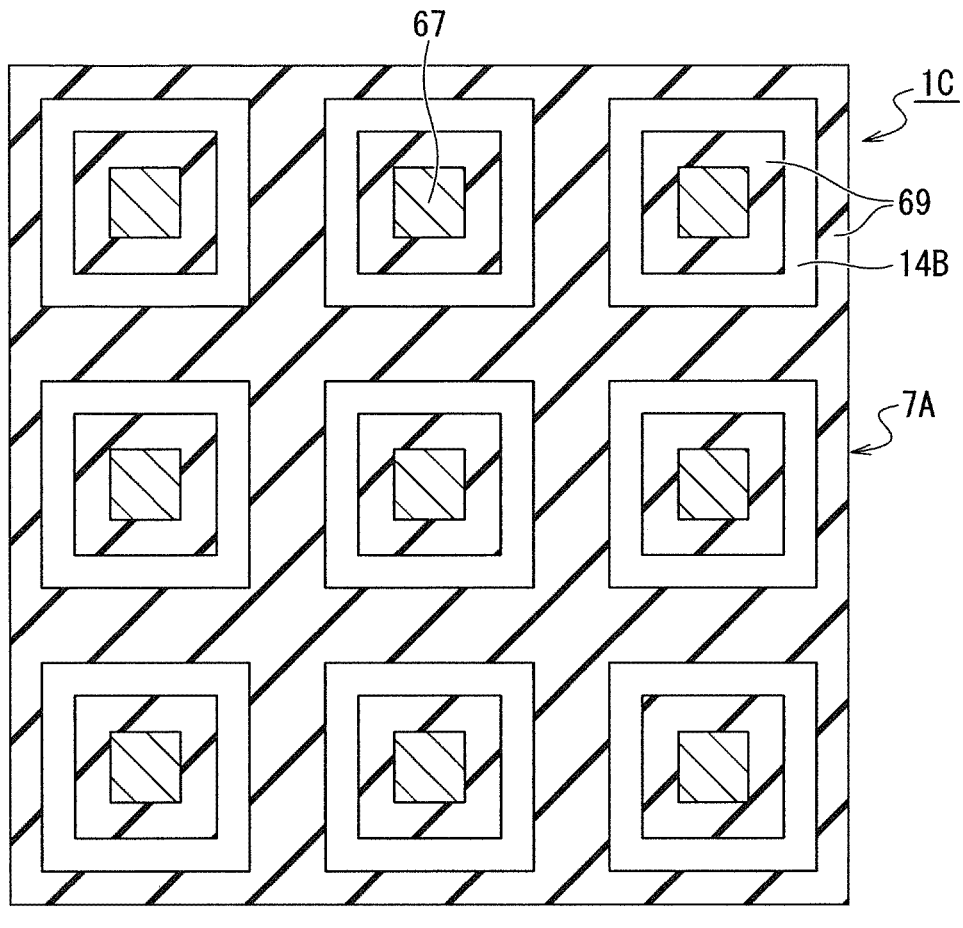
FIG. 10 is a plan view of a second substrate as viewed from a light incident side according to a fourth embodiment of the present technology.

FIG. 10 is a plan view of a second substrate 7A as viewed from the light incident side according to the fourth embodiment of the present technology. In FIG. 10, the same portions as those in FIG. 4 above are denoted by the same reference numerals, and a detailed description thereof is omitted.

In FIG. 10, the plurality of second electrodes 67 is arranged at equal pitches in the row direction and the column direction. The plurality of second electrodes 67 is electrically separated by a dug portion 14B formed by digging the second insulating film 69 of the second substrate 7A. The dug portion 14B is formed in a ring shape so as to surround each of the second electrodes 67, and the second electrode 67 is located at the center of the ring shape.

Note that, in FIG. 10, the dug portion 14B has a square shape, but may have a circular shape. In addition, although not illustrated in FIG. 10, on the first substrate 2, a plurality of first electrodes 33 is arranged at equal pitches in the row direction and the column direction, and the periphery of each first electrode 33 is surrounded by a ring-shaped dug portion 13.

Then, the second substrate 7A is joined to the first substrate 2 in alignment with the first substrate 2. As a result, the semiconductor device 1C is formed.
<Operation and Effect of Fourth Embodiment>

As described above, according to the fourth embodiment, by forming the ring-shaped dug portion 14B around each of the plurality of second electrodes 67, the temperature of the entire joining process can be further lowered to room temperature as compared with the first embodiment.

Fifth Embodiment

Next, a fifth embodiment will be described. The fifth embodiment is a modification of the first embodiment described above, and a case where a region in which a dug portion is provided and a region in which a dug portion is not provided are provided will be described.

Figure 11:
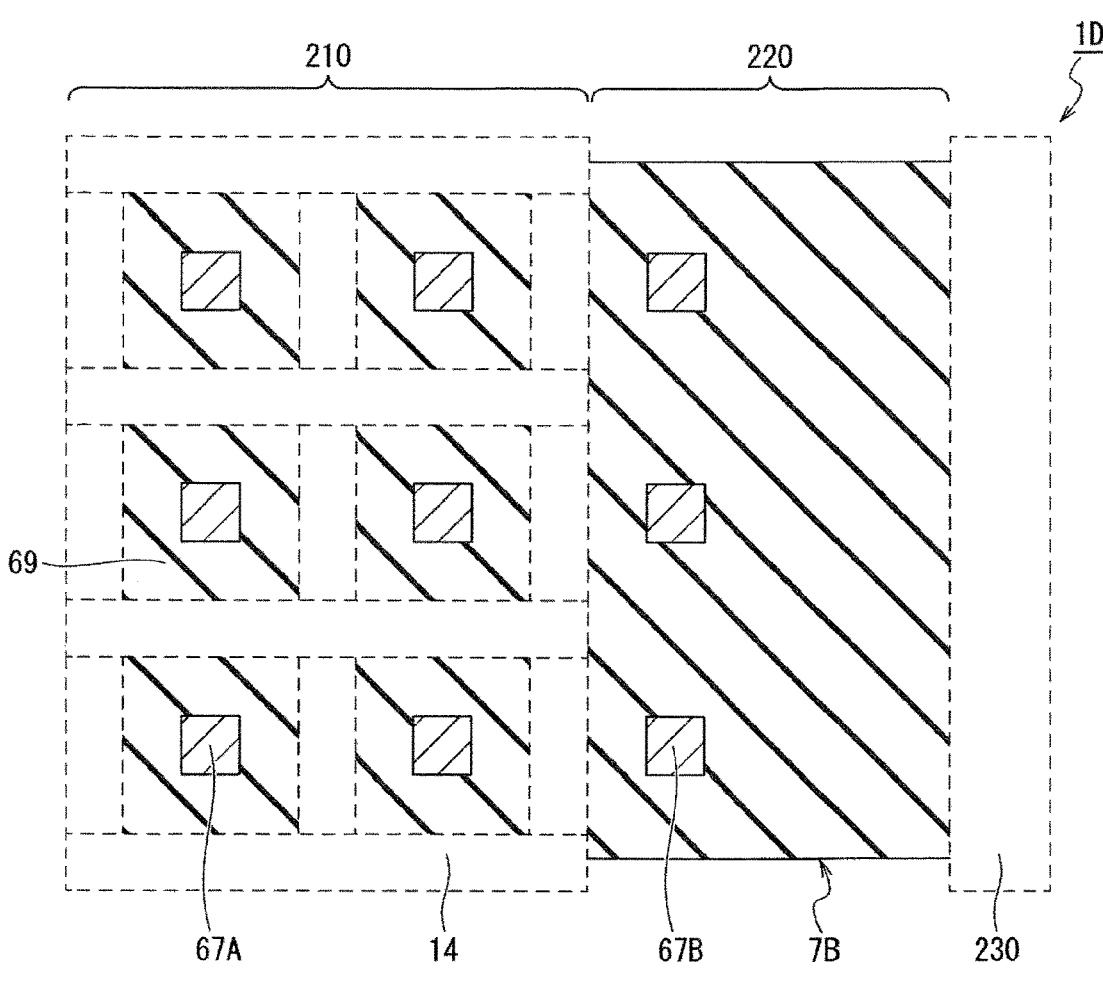
FIG. 11 is a plan view of a second substrate as viewed from a light incident side according to a fifth embodiment of the present technology.

FIG. 11 is a plan view of a second substrate 7B as viewed from the light incident side according to the fifth embodiment of the present technology. In FIG. 11, the same portions as those in FIG. 4 above are denoted by the same reference numerals, and a detailed description thereof is omitted.

In FIG. 11, the second substrate 7B is divided into a region 210 in which separation between electrodes is necessary, a region 220 in which separation between electrodes is unnecessary, and a dicing region 230. In the region 210, a plurality of second electrodes 67A is arranged at equal pitches in the row direction and the column direction. The plurality of second electrodes 67A is electrically separated by the dug portion 14 formed by digging the second insulating film 69 of the second substrate 7A.

Meanwhile, in the region 220, a plurality of second electrodes 67B is arranged at an equal pitch in the column direction. Note that the plurality of second electrodes 67B may be arranged at equal pitches in the row direction. Since the dicing region 230 requires strength, it is desirable not to provide the dug portion 14.

In addition, although not illustrated in FIG. 11, the first substrate 2 is also divided into a region 210 where separation between electrodes is necessary, a region 220 where separation between electrodes is unnecessary, and a dicing region 230.

Then, the second substrate 7B is joined to the first substrate 2 in alignment with the first substrate 2. As a result, the semiconductor device 1D is formed.

<Operation and Effect of Fifth Embodiment>

As described above, according to the fifth embodiment, by dividing the second substrate 7B into the region 210 where the separation between the electrodes is necessary, the region 220 where the separation between the electrodes is unnecessary, and the dicing region 230, the temperature of the entire joining process can be lowered to room temperature, and the joining strength of the semiconductor device 1D can be improved.

Sixth Embodiment

Next, a sixth embodiment will be described. The sixth embodiment is a modification of the first embodiment described above, and a variation of metal used for an insulating film and atomic diffusion bonding will be described.

Figure 12:
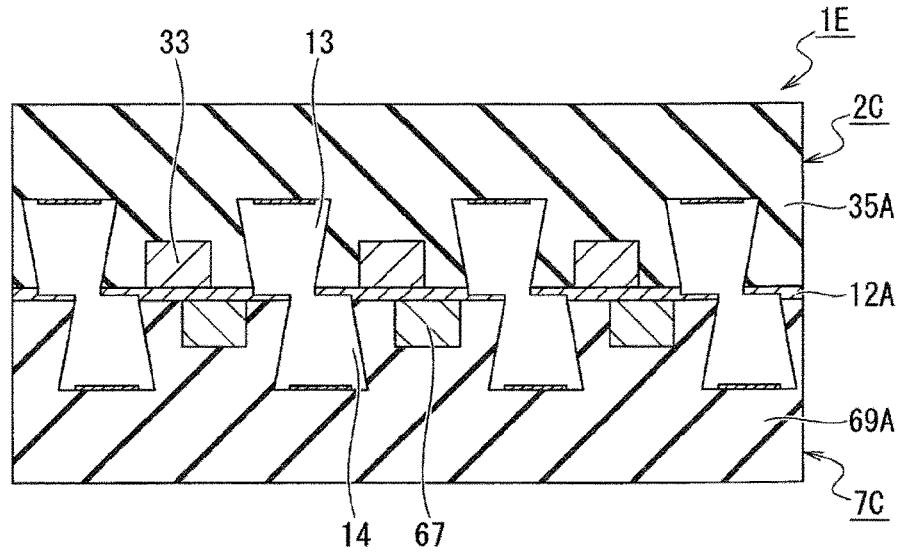
FIG. 12 is a cross-sectional view illustrating a state in which a first substrate and a second substrate are bonded together as a sixth embodiment of the present technology.

FIG. 12 is a cross-sectional view illustrating a state in which a first substrate 2C and a second substrate 7C are bonded together as the sixth embodiment of the present technology. In FIG. 12, the same portions as those in FIG. 5 above are denoted by the same reference numerals, and a detailed description thereof is omitted.

For a first insulating film 35A and a second insulating film 69A, an inorganic insulating film such as SiO2, SiN, SiCN, or SiCO is used. Note that, for the first insulating film 35A and the second insulating film 69A, an organic insulating film including polyamide or the like may be used, or a metal oxide such as Al2O3 or TiO2 may be used.

For the metal thin film 12A, a sputterable metal such as Ti, Cr, Mn, Au, or Al is used. Note that a conductive oxide such as ITO or IZGO may be used for the metal thin film 12A.

Then, the second substrate 7C is joined to the first substrate 2C in alignment with the first substrate 2C. As a result, the semiconductor device 1E is formed.

<Operation and Effect of Sixth Embodiment>

As described above, even in the sixth embodiment, similar effects to those of the first embodiment can be obtained.

Seventh Embodiment

Next, a seventh embodiment will be described. The seventh embodiment is a modification of the first embodiment described above, and a case where an etching stopper is provided in a dug portion will be described.

Figure 13:
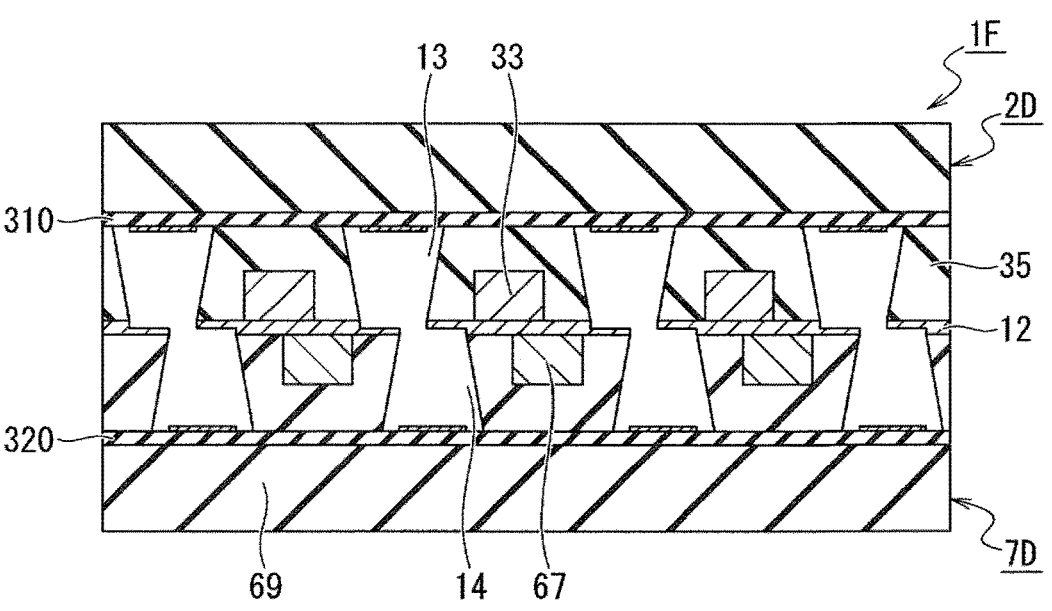
FIG. 13 is a cross-sectional view illustrating a state in which a first substrate and a second substrate are bonded together as a seventh embodiment of the present technology.

FIG. 13 is a cross-sectional view illustrating a state in which a first substrate 2D and a second substrate 7D are bonded together as the seventh embodiment of the present technology. In FIG. 13, the same portions as those in FIG. 5 above are denoted by the same reference numerals, and a detailed description thereof is omitted.

In FIG. 13, an etching stopper layer 310 for aligning the bottom surface of the dug portion 13 is formed on the first insulating film 35 of the first substrate 2D. In addition, an etching stopper layer 320 for aligning the bottom surface of the dug portion 14 is formed on the second insulating film 69 of the second substrate 7D. For the etching stopper layers 310 and 320, a film type different from that of the first insulating film 35 and the second insulating film 69, such as SiN, SiCN, or SiCO, is used.

Then, the second substrate 7D is aligned with the first substrate 2D and joined to the first substrate 2D. As a result, the semiconductor device 1F is formed.

<Operation and Effect of Seventh Embodiment>

As described above, according to the seventh embodiment, the etching stopper layer 310 for aligning the bottom surface of the dug portion 13 is formed in the first insulating film 35 of the first substrate 2D, and the etching stopper layer 320 for aligning the bottom surface of the dug portion 14 is formed in the second insulating film 69 of the second substrate 7D, which is useful for controlling the shape of the opening of each of the plurality of dug portions 13 and the plurality of dug portions 14.

Eighth Embodiment

Next, an eighth embodiment will be described. The eighth embodiment is a modification of the first embodiment described above, and a structure in which a bottom surface portion of a dug portion is enlarged will be described.

Figure 14:
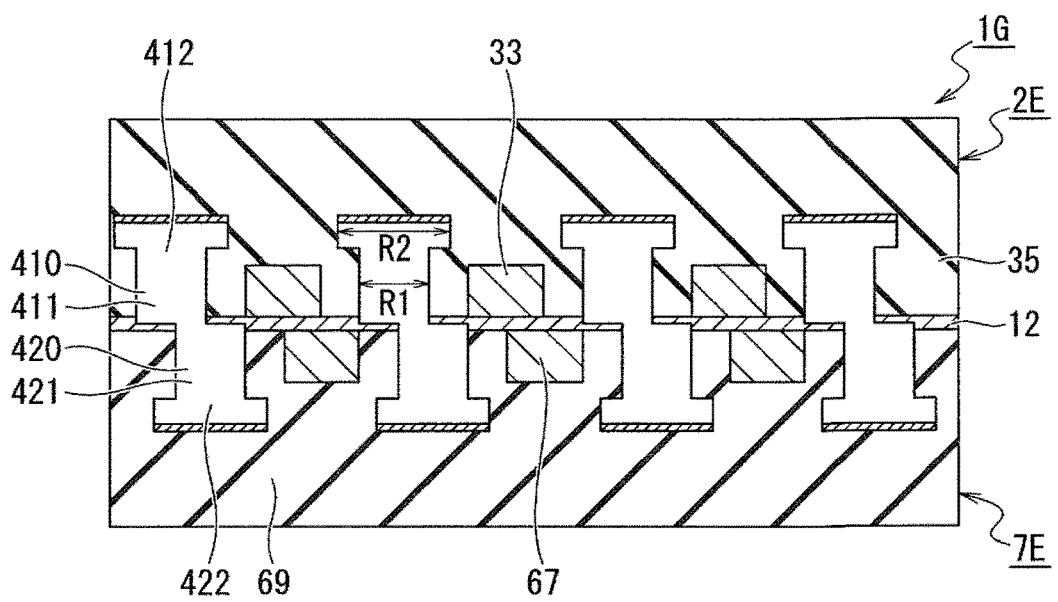
FIG. 14 is a cross-sectional view illustrating a state in which a first substrate and a second substrate are bonded together as an eighth embodiment of the present technology.

FIG. 14 is a cross-sectional view illustrating a state in which a first substrate 2E and a second substrate 7E are bonded together as the eighth embodiment of the present technology. In FIG. 14, the same portions as those in FIG. 5 above are denoted by the same reference numerals, and a detailed description thereof is omitted.

In FIG. 14, a dug portion 410 in which the first insulating film 35 is dug is formed between the adjacent first electrodes 33. In addition, a dug portion 420 formed by digging the second insulating film 69 is formed between the adjacent second electrodes 67. The dug portion 410 includes a first opening 411 having a diameter R1 from the bonding surface side on the first substrate 2E side toward the bottom surface side, and a second opening 412 located on the bottom surface side with respect to the first opening 411 and having a diameter R2 larger than the diameter R1. The dug portion 420 includes a first opening 421 having a diameter R1 from the bonding surface side on the second substrate 7E side toward the bottom surface side, and a second opening 422 located on the bottom surface side with respect to the first opening 421 and having a diameter R2 larger than the diameter R1.

Then, the second substrate 7E is aligned with the first substrate 2E and joined to the first substrate 2E. As a result, the semiconductor device 1G is formed.

<Operation and Effect of Eighth Embodiment>

As described above, according to the eighth embodiment, the dug portion 410 has a two-stage configuration of the first opening 411 and the second opening 412, and the dug portion 420 has a two-stage configuration of the first opening 421 and the second opening 422, so that the metal thin film 12 can be more reliably divided at the time of metal sputtering by atomic diffusion bonding.

OTHER EMBODIMENTS

As described above, the present technology has been described by the first to eighth embodiments and the first and second modifications of the first embodiment, but it should not be understood that the description and drawings constituting a part of this disclosure limit the present technology. It will be apparent to those skilled in the art that various alternative embodiments, examples, and operation techniques can be included in the present technology when understanding the spirit of the technical content disclosed in the first to eighth embodiments described above. In addition, the configurations disclosed in the first to eighth embodiments and the first and second modifications of the first embodiment can be appropriately combined within a range in which no contradiction occurs. For example, configurations disclosed by a plurality of different embodiments may be combined, or configurations disclosed by a plurality of different modifications of the same embodiment may be combined.

In addition, in each of the above embodiments, an example has been described in which the metal thin films 12 formed on the upper and lower substrates are integrated after joining. However, the present invention is not limited thereto, and the metal thin film 12 may be bonded while being vertically divided.

Figure 15:
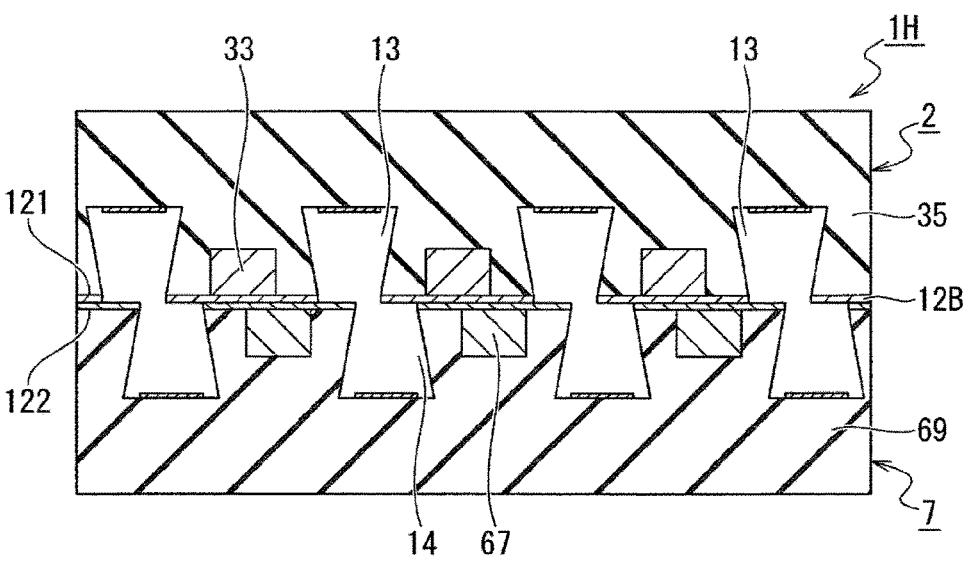
FIG. 15 is a cross-sectional view illustrating a state in which a first substrate and a second substrate are bonded together as another embodiment of the present technology.

FIG. 15 is a cross-sectional view illustrating a state in which the first substrate 2 and the second substrate 7 are bonded together as another embodiment of the present technology. In FIG. 15, the same portions as those in FIG. 5 above are denoted by the same reference numerals, and a detailed description thereof is omitted.

The metal thin film 12B includes a first metal thin film 121 formed on the bonding surface 41 on the first substrate 2 side and a second metal thin film 122 formed on the bonding surface 71 on the second substrate 7 side.

Then, the second substrate 7 is aligned with the first substrate 2, and the first metal thin film 121 and the second metal thin film 122 are joined to the first substrate 2 while being divided. As a result, the semiconductor device 1H is formed.

Note that the joining interface between the first metal thin film 121 and the second metal thin film 122 after bonding may or may not be flat. In addition, between the dug portion 13 and the dug portion 14, one end of the first metal thin film 121 and one end of the second metal thin film 122 may be joined in a shifted manner or may be joined in an aligned manner.

Figure 16:
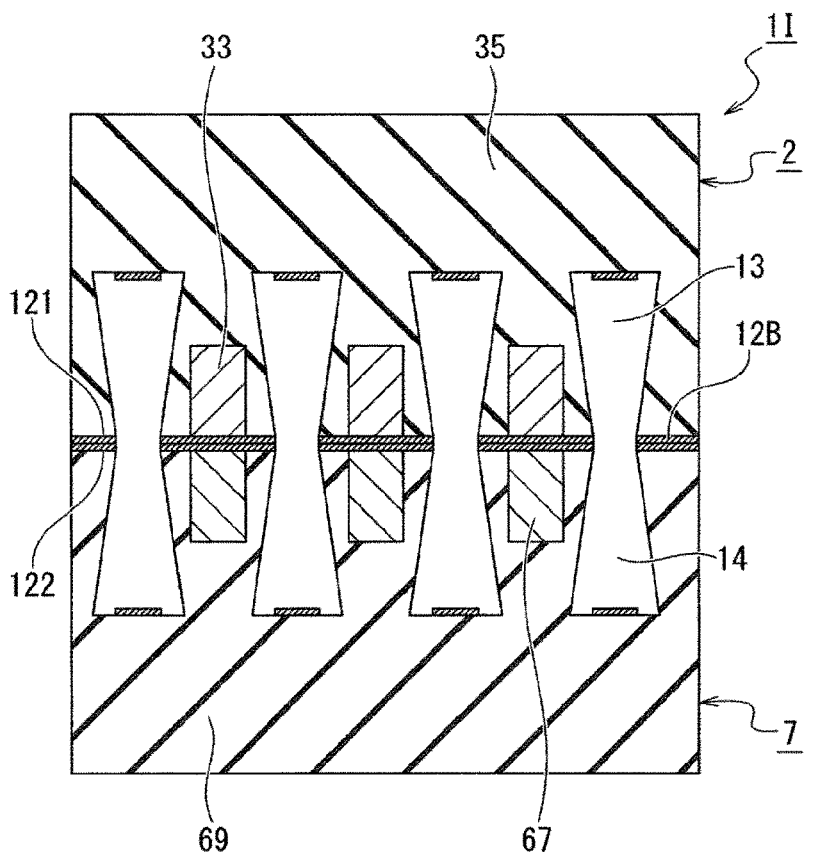
FIG. 16 is a cross-sectional view illustrating a state in which one end of a first metal thin film and one end of a second metal thin film are aligned and a first substrate and a second substrate are bonded to each other as another embodiment of the present technology.

FIG. 16 is a cross-sectional view illustrating a state in which one end of the first metal thin film 121 and one end of the second metal thin film 122 are aligned and the first substrate 2 and the second substrate 7 are bonded to each other between the dug portion 13 and the dug portion 14 as another embodiment of the present technology. In FIG. 16, the same portions as those in FIG. 15 above are denoted by the same reference numerals, and a detailed description thereof is omitted.

The second substrate 7 is aligned with the first substrate 2, one end of the first metal thin film 121 and one end of the second metal thin film 122 are aligned between the dug portion 13 and the dug portion 14, and the first metal thin film 121 and the second metal thin film 122 are joined to the first substrate 2 while being divided. As a result, the semiconductor device 1I is formed.

Note that the metal thin film 12B may have a configuration in which the first metal thin film 121 and the second metal thin film 122 are directly joined or integrated after joining.

In addition, the example in which the first metal thin film 121 and the second metal thin film 122 are joined while being divided can also be applied to the configurations of the metal thin film 12 in the first to eighth embodiments and the first modification and the second modification of the first embodiment.

Furthermore, in each of the above embodiments, an example in which the first electrode 33 is embedded in the first insulating film 35 and the second electrode 67 is embedded in the second insulating film 69 has been described. The present invention is not limited to this, for example, a plurality of insulating films in which the first insulating film 35 is laminated in multiple layers may be formed, and a plurality of insulating films in which the second insulating film 69 is laminated in multiple layers may be formed. In this case, the first electrode 33 may be formed so as to be embedded across a plurality of insulating films. In addition, the second electrode 67 may be formed so as to be embedded across a plurality of insulating films.

In addition, in each of the above embodiments, the example in which the first electrode 33 and the second electrode 67 are formed in the pixel region has been described. The present invention is not limited to this, and for example, the first electrode 33 and the second electrode 67 may be formed outside the pixel region. One set of the first electrode 33 and the second electrode 67 may be electrically connected to a plurality of pixels inside or outside the pixel region.

According to the above configuration, for example, the power supplied from the outside to the first substrate 2 can be supplied to the second substrate 7 via the first electrode 33 and the second electrode 67. In addition, it is possible to connect to a reference potential (ground potential or fixed potential) via the first electrode 33 and the second electrode 67 so as to realize electrical shielding.

Application Example to Endoscopic Surgery
System

The technology according to an embodiment of the present disclosure (present technology) can be applied to various products. For example, the technology according to an embodiment of the present disclosure may be applied to an endoscopic surgery system.

Figure 17:
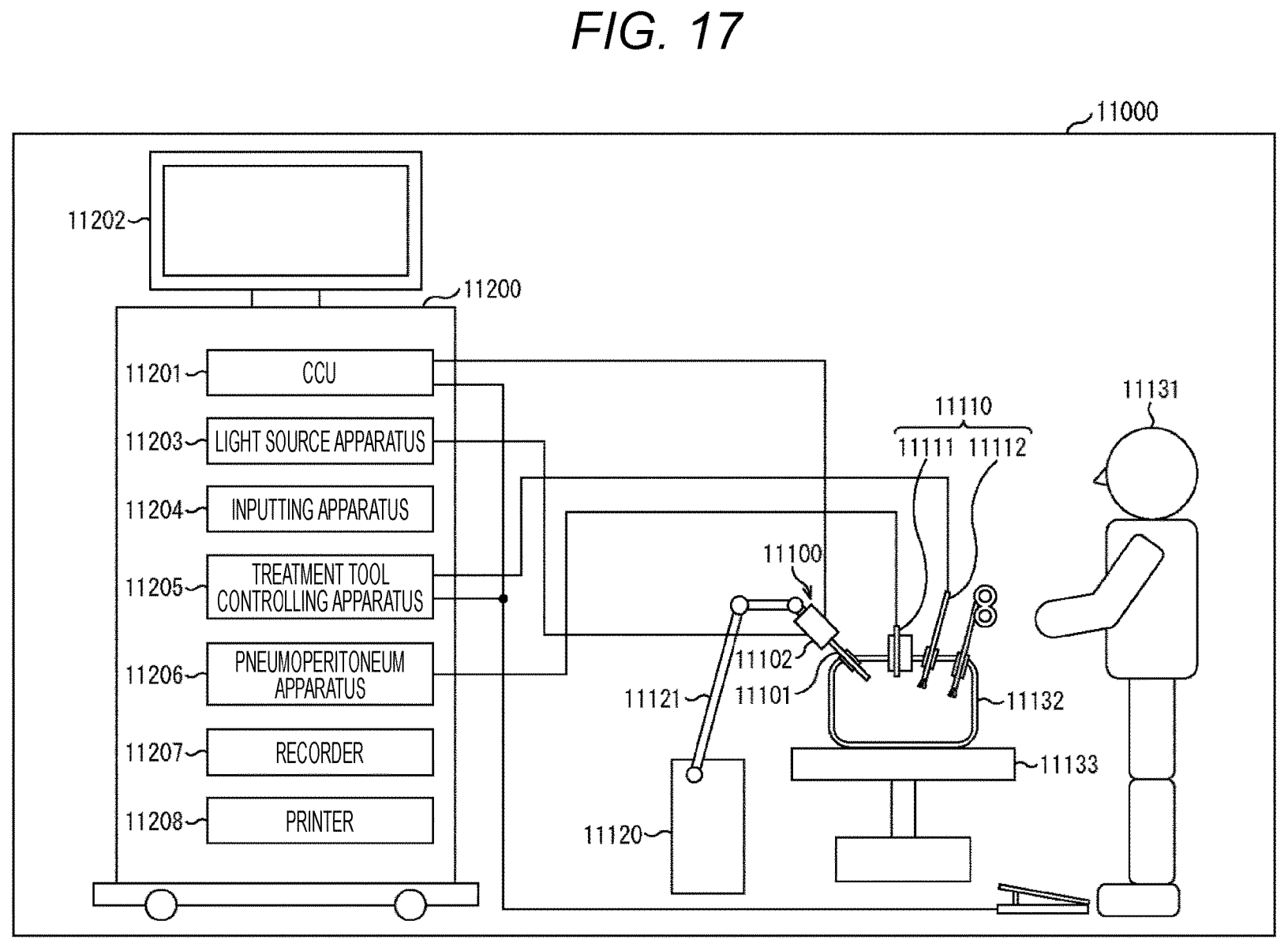

FIG. 17 is a view illustrating an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As illustrated, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example illustrated, the endoscope 11100 is illustrated which includes as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumo-peritoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. In a case where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed high-lights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow band light and/or excitation light suitable for special light observation as described above.

Figure 18:
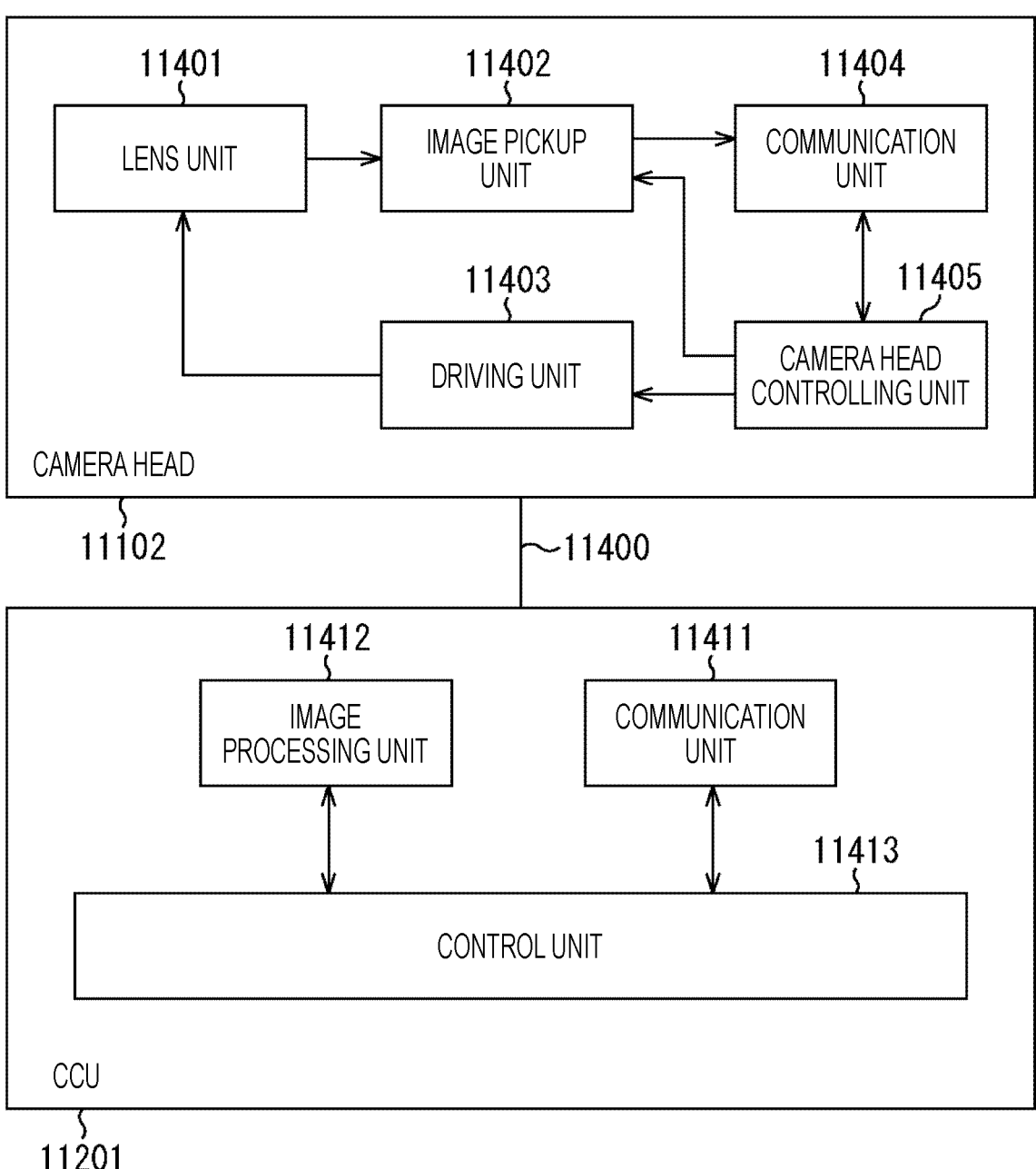
FIG. 18 is a block diagram illustrating an example of a functional configuration of a camera head and a camera control unit (CCU).

FIG. 18 is a block diagram illustrating an example of a functional configuration of the camera head 11102 and the CCU 11201 illustrated in FIG. 17.

The camera head 11102 includes a lens unit 11401, an image pickup unit 11402, a driving unit 11403, a commu-nication unit 11404 and a camera head controlling unit 11405. The CCU 11201 includes a communication unit 11411, an image processing unit 11412 and a control unit

11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type).

In a case where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, in a case where the image pickup unit 11402 is configured as that of the multi-plate type, a plurality of systems of lens units 11401 is provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information regarding image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example illustrated, communication is performed by wired communication using the transmission cable 11400, the communication between the camera head 11102 and the CCU 11201 may be performed by wireless communication.

An example of the endoscopic surgery system to which the technology according to an embodiment of the present disclosure can be applied has been described above. The technology according to the present disclosure can be applied to, for example, the endoscope 11100, the image pickup unit 11402 of the camera head 11102, the image processing unit 11412 of the CCU 11201, and the like among the above-described configurations. Specifically, the semiconductor device 1 in FIG. 1 can be applied to the image pickup unit 10402.

Note that, here, the endoscopic surgery system has been described as an example, but the technology according to an embodiment of the present disclosure may be applied to, for example, a microscopic surgery system or the like.

Application Example to Mobile Body

The technology according to an embodiment of the present disclosure (present technology) can be applied to various products. For example, the technology according to an embodiment of the present disclosure may be implemented as a device mounted on any type of mobile body such as an automobile, an electric vehicle, a hybrid electric vehicle, a motorcycle, a bicycle, a personal mobility, an airplane, a drone, a ship, a robot, and the like.

Figure 19:
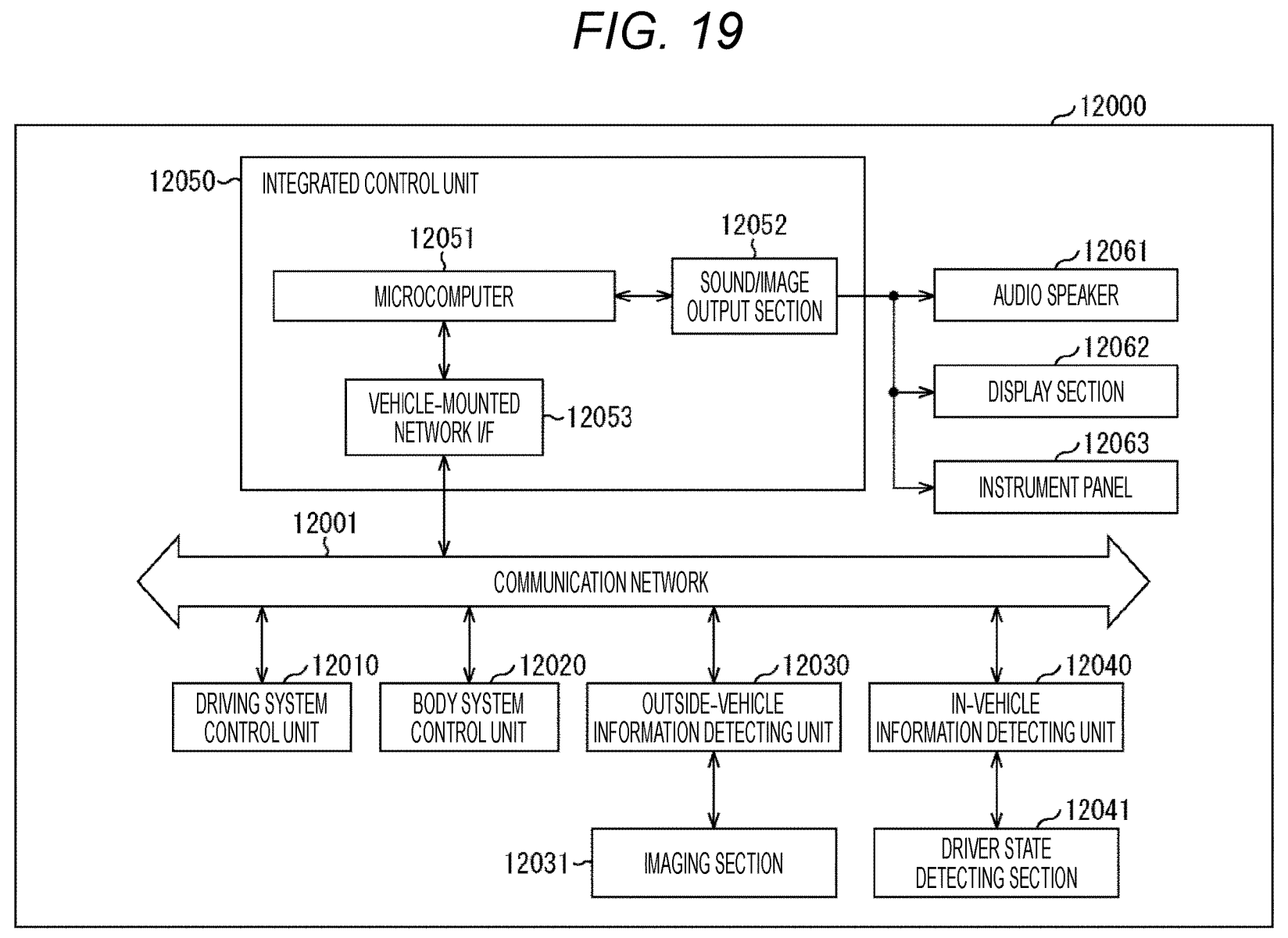

FIG. 19 is a block diagram illustrating an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an image pickup unit 12031. The outside-vehicle information detecting unit 12030 makes the image pickup unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The image pickup unit 12031 is an optical sensor that receives light, and which outputs an electric signal corresponding to a received light amount of the light. The image pickup unit 12031 can output the electric signal as an image, or can output the electric signal as information about a measured distance. In addition, the light received by the image pickup unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 19, an audio speaker 12061, a display section 12062, and an instrument panel 12063 are illustrated as the output device. The display section 12062 may, for example, include at least one of an on-board display or a head-up display.

Figure 20:
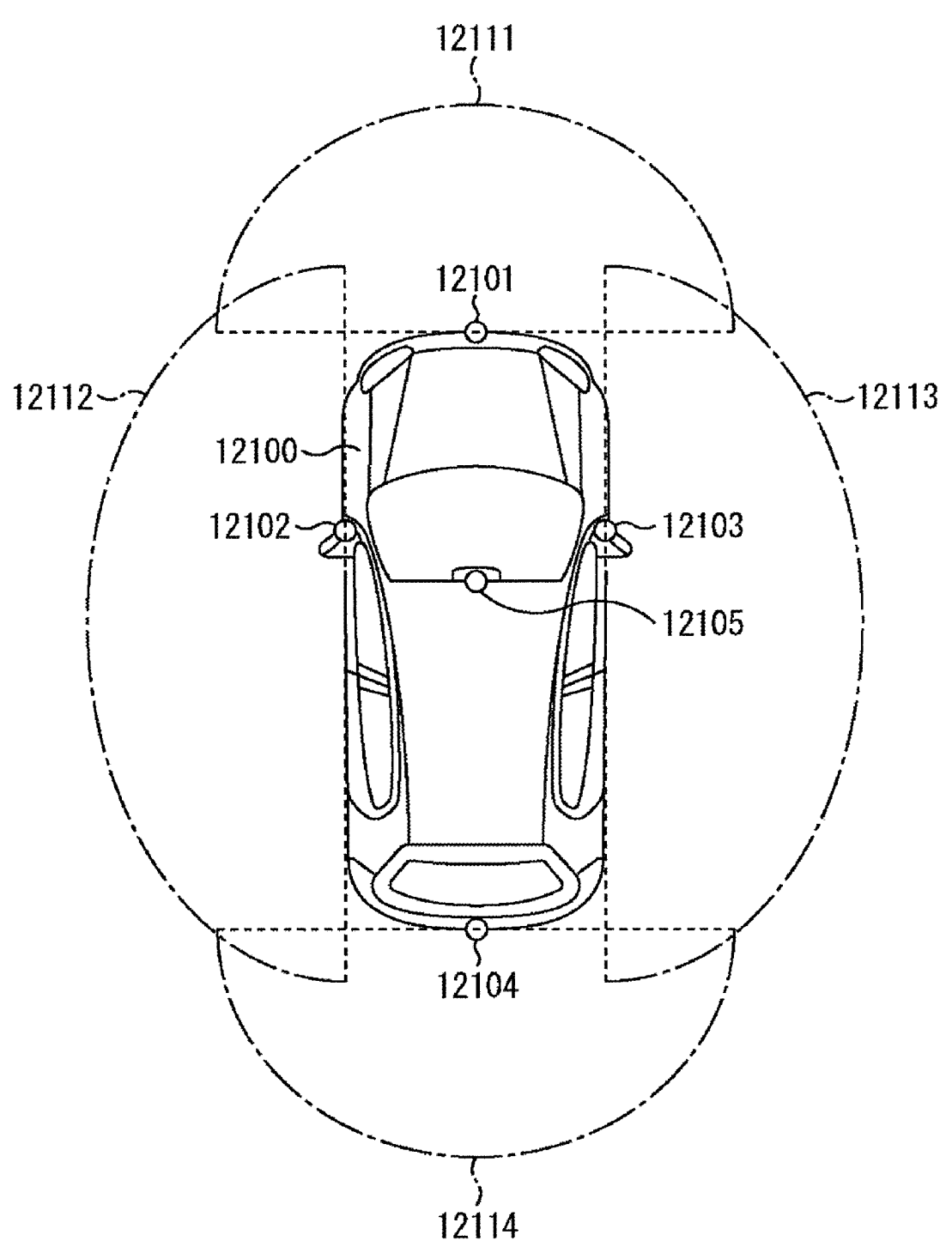
FIG. 20 is a diagram of assistance in explaining an example of installation positions of an outside-vehicle information detecting section and an image pickup unit.

FIG. 20 is a diagram illustrating an example of the installation position of the image pickup unit 12031.

In FIG. 20, the vehicle 12100 includes image pickup units 12101, 12102, 12103, 12104, and 12105 as the image pickup unit 12031.

The image pickup units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The image pickup unit 12101 provided to the front nose and the image pickup unit 12105 provided to the upper portion of the windshield within the interior of the vehicle obtain mainly an image of the front of the vehicle 12100. The image pickup units 12102 and 12103 provided to the sideview mirrors obtain mainly an image of the sides of the vehicle 12100. The image pickup unit 12104 provided to the rear bumper or the back door obtains mainly an image of the rear of the vehicle 12100. The front images acquired by the image pickup units 12101 and 12105 are mainly used for detecting a preceding vehicle, a pedestrian, an obstacle, a traffic light, a traffic sign, a lane, or the like.

Incidentally, FIG. 20 illustrates an example of image pickup ranges of the image pickup units 12101 to 12104. An image pickup range 12111 represents the image pickup range of the image pickup unit 12101 provided to the front nose. Image pickup ranges 12112 and 12113 respectively represent the image pickup ranges of the image pickup units 12102 and 12103 provided to the sideview mirrors. An image pickup range 12114 represents the image pickup range of the image pickup unit 12104 provided to the rear bumper or the back door. A bird's-eye image of the vehicle 12100 as viewed from above is obtained by superimposing image data imaged by the image pickup units 12101 to 12104, for example.

At least one of the image pickup units 12101 to 12104 may have a function of obtaining distance information. For example, at least one of the image pickup units 12101 to 12104 may be a stereo camera constituted of a plurality of image pickup elements, or may be an image pickup element having pixels for phase difference detection.

For example, the microcomputer 12051 can determine a distance to each three-dimensional object within the image pickup ranges 12111 to 12114 and a temporal change in the distance (relative speed with respect to the vehicle 12100) on the basis of the distance information obtained from the image pickup units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the image pickup units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the image pickup units 12101 to 12104 may be an infrared camera that detects infrared rays. The microcomputer 12051 can, for example, recognize a pedestrian by determining whether or not there is a pedestrian in picked up images of the image pickup units 12101 to 12104. Such recognition of a pedestrian is, for example, performed by a procedure of extracting characteristic points in the picked up images of the image pickup units 12101 to 12104 as infrared cameras and a procedure of determining whether or not it is the pedestrian by performing pattern matching processing on a series of characteristic points representing the contour of the object. When the microcomputer 12051 determines that there is a pedestrian in the picked up images of the image pickup units 12101 to 12104, and thus recognizes the pedestrian, the sound/image output section 12052 controls the display section 12062 so that a square contour line for emphasis is displayed so as to be superimposed on the recognized pedestrian. In addition, the sound/image output section 12052 may also control the display section 12062 so that an icon or the like representing the pedestrian is displayed at a desired position.

An example of the vehicle control system to which the technology according to an embodiment of the present disclosure can be applied has been described above. The technology according to an embodiment of the present disclosure can be applied to, for example, the image pickup unit 12031 and the like among the configurations described above. Specifically, the semiconductor device 1 in FIG. 1 can be applied to the image pickup unit 12031.

Note that the present disclosure can also have the following configurations.

(1)

A semiconductor device including:

a first insulating film formed on a first semiconductor substrate;

a plurality of first joining electrodes formed on a surface of the first insulating film;

a second insulating film formed on a second semiconductor substrate that is hybrid joined to the first semiconductor substrate;

a plurality of second joining electrodes formed on a surface of the second insulating film; and a metal film covering an entire surface of a joining surface including the first insulating film and the plurality of first joining electrodes, and an entire surface of a joining surface including the second insulating film and the plurality of second joining electrodes, in which the first insulating film includes a first dug portion formed between at least some joining electrodes of the plurality of first joining electrodes and separating the metal film between the joining electrodes, and the second insulating film includes a second dug portion formed between at least some joining electrodes of the plurality of second joining electrodes and separating the metal film between the joining electrodes.

(2)

The semiconductor device according to (1), in which each of the first and second dug portions has a first diameter on a joining surface side and a second diameter larger than the first diameter on a bottom surface side, and the metal film is divided in a middle.

(3)

The semiconductor device according to (2), in which each of the first and second dug portions has a reverse tapered shape, and the metal film is divided in a middle.

(4)

The semiconductor device according to (2), in which each of the first and second dug portions includes a first opening having the first diameter from the joining surface side toward the bottom surface side, and a second opening positioned closer to the bottom surface side than the first opening and having the second diameter.

(5)

The semiconductor device according to (1), in which an opening width of each of the first and second dug portions is larger than twice an alignment deviation generated at a time of joining a first joining electrode of the plurality of first joining electrodes and a second joining electrode of the plurality of second joining electrodes.

(6)

The semiconductor device according to (1), in which the first dug portion has a ring shape, and a first joining electrode of the plurality of first joining electrodes is formed at a center portion of the ring shape.

(7)

The semiconductor device according to (1), in which the second dug portion has a ring shape, and a second joining electrode of the plurality of second joining electrodes is formed at a center portion of the ring shape.

(8)

The semiconductor device according to (1), in which the first insulating film forms an etching stopper layer for aligning bottom surfaces of a plurality of the first dug portion.

(9)

The semiconductor device according to (1), in which the second insulating film forms an etching stopper layer for aligning bottom surfaces of a plurality of the second dug portion.

(10)

The semiconductor device according to (8) or (9), in which the etching stopper layer uses a material different from a material of the first insulating film or the second insulating film.

(11)

The semiconductor device according to (1), in which the first and second insulating films are at least one of an inorganic insulating film containing at least one of $SiO_2$, $SiN$, $SiCN$, or $SiCO$, an organic insulating film containing at least a polyamide, or a metal oxide containing any one of $Al_2O_3$ or $TiO_2$, and the metal film is at least one of a metal containing at least one of Ti, Cr, Mn, Au, or Al, or a conductive oxide containing any one of ITO and IZGO.

(12)

The semiconductor device according to (1), in which the metal film includes a first metal film covering an entire surface of a joining surface including the first insulating film and the plurality of first joint electrodes, and a second metal film covering an entire surface of a joining surface including the second insulating film and the plurality of second joint electrodes.

(13)

The semiconductor device according to (12), in which the first metal film and the second metal film are integrated in a joined state between the first semiconductor substrate and the second semiconductor substrate.

(14)

The semiconductor device according to (12), in which the first metal film and the second metal film are divided in a joined state between the first semiconductor substrate and the second semiconductor substrate.

(15)

A semiconductor device including:

a first wiring layer including a first insulating film, a first electrode, a second electrode, a first dug portion formed between the first electrode and the second electrode, and a first metal film; and a second wiring layer including a second insulating film, a third electrode, a fourth electrode, a second dug portion formed between the third electrode and the fourth electrode, and a second metal film, in which a first region of the first metal film is in contact with a first region of the first electrode and a first region of the second metal film, a second region of the first metal film is in contact with a first region of the first insulating film and a second region of the second metal film, and a third region of the first metal film is in contact with a second region of the first insulating film and a first region of the second dug portion.

(16)

The semiconductor device according to (15), in which a first region of the second metal film is in contact with a first region of the third electrode, and a second region of the second metal film is in contact with a second region of the third electrode.

(17)

A method for manufacturing a semiconductor device, the method including:

forming a plurality of first joining electrodes on a surface of a first insulating film formed on a first semiconductor substrate;

forming a plurality of second joining electrodes on a surface of a second insulating film formed on a second semiconductor substrate;

forming a first dug portion obtained by digging the first insulating film between at least some joining electrodes of the plurality of first joining electrodes;

forming a second dug portion obtained by digging the second insulating film between at least some joining electrodes of the plurality of second joining electrodes;

covering an entire surface of a joining surface including the first insulating film and the plurality of first joint electrodes and a bottom surface of the first dug portion with a metal film;

covering an entire surface of a joining surface including the second insulating film and the plurality of second joint electrodes and a bottom surface of the second dug portion with a metal film; and

27 hybrid joining the plurality of first joining electrodes of the first semiconductor substrate and the plurality of second joining electrodes of the second semiconductor substrate.

(18)
The method for manufacturing the semiconductor device according to (17),
in which the forming the plurality of first joining electrodes includes forming a dummy pattern of the first dug portion constituted by a same metal as the plurality of first joining electrodes simultaneously with the plurality of first joining electrodes,
the forming the first dug portion includes forming the first dug portion by removing metal of the dummy pattern,
the forming the plurality of second joining electrodes includes forming a dummy pattern of the second dug portion constituted by a same metal as the plurality of second joining electrodes simultaneously with the plurality of second joining electrodes, and
the forming the second dug portion includes forming the second dug portion by removing metal of the dummy pattern.

(19)
An electronic device including
a semiconductor device including:
a first insulating film formed on a first semiconductor substrate;
a plurality of first joining electrodes formed on a surface of the first insulating film;
a second insulating film formed on a second semiconductor substrate that is hybrid joined to the first semiconductor substrate;
a plurality of second joining electrodes formed on a surface of the second insulating film; and
a metal film covering an entire surface of a joining surface including the first insulating film and the plurality of first joining electrodes, and an entire surface of a joining surface including the second insulating film and the plurality of second joining electrodes,
in which the first insulating film includes a first dug portion formed between at least some joining electrodes of the plurality of first joining electrodes and separating the metal film between the joining electrodes, and
the second insulating film includes a second dug portion formed between at least some joining electrodes of the plurality of second joining electrodes and separating the metal film between the joining electrodes.

(20)
The electronic device according to (19),
in which the semiconductor device is used for an image sensor.

REFERENCE SIGNS LIST 1, 1A, 1B, 1C, 1D, 1E, 1F, 1G, 1H, 1I Semiconductor device
2, 2C, 2D, 2E First substrate
2a, 7a Semiconductor layer
2b, 7b, 31b, 59b Wiring layer
2c, 7c Electrode layer
3 Pixel
4 Pixel region
5 Pixel drive line
6 Vertical signal line
7, 7A, 7B, 7C, 7D, 7E Second substrate
8 Vertical drive circuit

28

9 Column signal processing circuit
10 Horizontal drive circuit
11 System control circuit
12, 12A, 12B Metal thin film
12a, 22, 38-1 Insulating film
13, 14, 14A, 14B Dug portion
15 Protective film
17 Color filter layer
19 On-chip lens
20, 50 Semiconductor substrate
21 Photoelectric conversion unit
23, 51 Drain
27, 55
29, 57
25, 51 Gate insulating film
27, 55 Gate electrode
29, 57 Interlayer insulating film
31, 59 Embedded wiring
31a Barrier metal layer
32, 61 Anti-diffusion insulating film
33 First electrode
33-1 First semiconductor substrate
33a, 59a, 67a Barrier metal layer
33b First electrode film
34 Pixel array
35A First insulating film
37-1, 59-1 Multilayer wiring layer
39-1 Light shielding film
41, 71 Bonding surface
41-1 Optical black region
42-1 Effective pixel array
43-1 Flattening film
44-1 Color filter
45-1 On-semiconductor substrate lens
52-1, 64-1 Conductive via
54-1 Second semiconductor substrate
55-1 Logic circuit
67, 67A, 67B Second electrode
67b Second electrode film
69, 69A Second insulating film
100 Resist pattern
110 Reverse taper dummy pattern
121 First metal thin film
122 Second metal thin film
210, 220 Region
230 Dicing region
310, 320 Etching stopper layer
330-1 Surface
331 First electrode pad
332, 672 Dummy electrode
333, 334, 351-1, 354-1, 571-1, 573-1, 574-1, 673, 674 Wiring
410, 420 Dug portion
411, 421 First opening
412, 422 Second opening
671 Second electrode pad
10402, 11402, 12031, 12101, 12102, 12103, 12104, 12105 Image pickup unit
11000 Endoscopic surgery system
11100 Endoscope
11101 Lens barrel
11102 Camera head
11110 Surgical tool
11111 Pneumoperitoneum tube
11112 Energy device
11120 Supporting arm apparatus
11131 Surgeon (medical doctor)

11132 Patient
11133 Patient bed
11200 Cart
11201 Camera control unit (CCU)
11202 Display apparatus
11203 Light source apparatus
11204 Inputting apparatus
11205 Treatment tool controlling apparatus
11206 Pneumoperitoneum apparatus
11207 Recorder
11208 Printer
11400 Transmission cable
11401 Lens unit
11403 Driving unit
11404, 11411 Communication unit
11405 Camera head controlling unit
11412 Image processing unit
11413 Control unit
12000 Vehicle control system
12001 Communication network
12010 Driving system control unit
12020 Body system control unit
12030 Outside-vehicle information detecting unit
12040 In-vehicle information detecting unit
12041 Driver state detecting section
12050 Integrated control unit
12051 Microcomputer
12052 Sound/image output section
12061 Audio speaker
12062 Display section
12063 Instrument panel
12100 Vehicle
12111, 12112, 12113, 12114 Image pickup range

The invention claimed is:

1. A semiconductor device comprising:
a first insulating film formed on a first semiconductor substrate;
a plurality of first joining electrodes formed on a surface of the first insulating film;
a second insulating film formed on a second semiconductor substrate that is hybrid joined to the first semiconductor substrate;
a plurality of second joining electrodes formed on a surface of the second insulating film; and
a metal film covering an entire surface of a joining surface including the first insulating film and the plurality of first joining electrodes, and an entire surface of a joining surface including the second insulating film and the plurality of second joining electrodes,
wherein the first insulating film includes a first dug portion formed between at least some joining electrodes of the plurality of first joining electrodes and separating the metal film between the joining electrodes, and
the second insulating film includes a second dug portion formed between at least some joining electrodes of the plurality of second joining electrodes and separating the metal film between the joining electrodes.

2. The semiconductor device according to claim 1,
wherein each of the first and second dug portions has a first diameter on a joining surface side and a second diameter larger than the first diameter on a bottom surface side, and the metal film is divided in a middle.

3. The semiconductor device according to claim 2,
wherein each of the first and second dug portions has a reverse tapered shape, and the metal film is divided in a middle.

4. The semiconductor device according to claim 2,
wherein each of the first and second dug portions includes a first opening having the first diameter from the joining surface side toward the bottom surface side, and a second opening positioned closer to the bottom surface side than the first opening and having the second diameter.

5. The semiconductor device according to claim 1,
wherein an opening width of each of the first and second dug portions is larger than twice an alignment deviation generated at a time of joining a first joining electrode of the plurality of first joining electrodes and a second joining electrode of the plurality of second joining electrodes.

6. The semiconductor device according to claim 1,
wherein the first dug portion has a ring shape, and a first joining electrode of the plurality of first joining electrodes is formed at a center portion of the ring shape.

7. The semiconductor device according to claim 1,
wherein the second dug portion has a ring shape, and a second joining electrode of the plurality of second joining electrodes is formed at a center portion of the ring shape.

8. The semiconductor device according to claim 1,
wherein the first insulating film forms an etching stopper layer for aligning bottom surfaces of a plurality of the first dug portion.

9. The semiconductor device according to claim 1,
wherein the second insulating film forms an etching stopper layer for aligning bottom surfaces of a plurality of the second dug portion.

10. The semiconductor device according to claim 8,
wherein the etching stopper layer uses a material different from a material of the first insulating film or the second insulating film.

11. The semiconductor device according to claim 1,
wherein the first and second insulating films are at least one of an inorganic insulating film containing at least one of $SiO_2$, $SiN$, $SiCN$, or $SiCO$, an organic insulating film containing at least a polyamide, or a metal oxide containing any one of $Al_2O_3$ or $TiO_2$, and
the metal film is at least one of a metal containing at least one of Ti, Cr, Mn, Au, or Al, or a conductive oxide containing any one of ITO and IZGO.

12. The semiconductor device according to claim 1,
wherein the metal film includes a first metal film covering an entire surface of a joining surface including the first insulating film and the plurality of first joint electrodes, and a second metal film covering an entire surface of a joining surface including the second insulating film and the plurality of second joint electrodes.

13. The semiconductor device according to claim 12,
wherein the first metal film and the second metal film are integrated in a joined state between the first semiconductor substrate and the second semiconductor substrate.

14. The semiconductor device according to claim 12,
wherein the first metal film and the second metal film are divided in a joined state between the first semiconductor substrate and the second semiconductor substrate.

15. A method for manufacturing a semiconductor device, the method comprising:
forming a plurality of first joining electrodes on a surface of a first insulating film formed on a first semiconductor substrate;

forming a plurality of second joining electrodes on a surface of a second insulating film formed on a second semiconductor substrate;

forming a first dug portion obtained by digging the first insulating film between at least some joining electrodes of the plurality of first joining electrodes;

forming a second dug portion obtained by digging the second insulating film between at least some joining electrodes of the plurality of second joining electrodes;

covering an entire surface of a joining surface including the first insulating film and the plurality of first joint electrodes and a bottom surface of the first dug portion with a metal film;

covering an entire surface of a joining surface including the second insulating film and the plurality of second joint electrodes and a bottom surface of the second dug portion with a metal film; and hybrid joining the plurality of first joining electrodes of the first semiconductor substrate and the plurality of second joining electrodes of the second semiconductor substrate.

16. The method for manufacturing the semiconductor device according to claim 15, wherein the forming the plurality of first joining electrodes includes forming a dummy pattern of the first dug portion constituted by a same metal as the plurality of first joining electrodes simultaneously with the plurality of first joining electrodes, the forming the first dug portion includes forming the first dug portion by removing metal of the dummy pattern, the forming the plurality of second joining electrodes includes forming a dummy pattern of the second dug portion constituted by a same metal as the plurality of second joining electrodes simultaneously with the plurality of second joining electrodes, and the forming the second dug portion includes forming the second dug portion by removing metal of the dummy pattern.

17. An electronic device comprising a semiconductor device including:

a first insulating film formed on a first semiconductor substrate;

a plurality of first joining electrodes formed on a surface of the first insulating film;

a second insulating film formed on a second semiconductor substrate that is hybrid joined to the first semiconductor substrate;

a plurality of second joining electrodes formed on a surface of the second insulating film; and a metal film covering an entire surface of a joining surface including the first insulating film and the plurality of first joining electrodes, and an entire surface of a joining surface including the second insulating film and the plurality of second joining electrodes, wherein the first insulating film includes a first dug portion formed between at least some joining electrodes of the plurality of first joining electrodes and separating the metal film between the joining electrodes, and the second insulating film includes a second dug portion formed between at least some joining electrodes of the plurality of second joining electrodes and separating the metal film between the joining electrodes.

18. The electronic device according to claim 17, wherein the semiconductor device is used for an image sensor.

* * * * *